United States Patent
Lu et al.

(10) Patent No.: US 12,500,143 B2
(45) Date of Patent: Dec. 16, 2025

(54) BONDING STRUCTURE, SEMICONDUCTOR CHIP AND FABRICATING METHOD THEREOF

(71) Applicant: MACRONIX International Co., Ltd., Hsinchu (TW)

(72) Inventors: Cheng-Hsien Lu, Taoyuan (TW); Wei-Lun Weng, Tainan (TW); Ming-Hsiu Lee, Hsinchu (TW); Dai-Ying Lee, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 464 days.

(21) Appl. No.: 18/186,212

(22) Filed: Mar. 20, 2023

(65) Prior Publication Data

US 2024/0321686 A1    Sep. 26, 2024

(51) Int. Cl.
| | |
|---|---|
| *H01L 23/48* | (2006.01) |
| *H01L 21/768* | (2006.01) |
| *H01L 23/00* | (2006.01) |
| *H01L 23/522* | (2006.01) |
| *H01L 23/528* | (2006.01) |
| *H01L 23/532* | (2006.01) |
| *H01L 25/065* | (2023.01) |

(52) U.S. Cl.
CPC ...... *H01L 23/481* (2013.01); *H01L 21/76892* (2013.01); *H01L 21/76898* (2013.01); *H01L 23/5226* (2013.01); *H01L 25/0657* (2013.01)

(58) Field of Classification Search
CPC ............. H01L 23/481; H01L 21/76892; H01L 21/76898; H01L 23/5226; H01L 25/0657; H01L 2225/06513; H01L 2225/06517; H01L 23/53209; H01L 21/76864; H01L 23/5283; H01L 24/24; H01L 2224/24146
See application file for complete search history.

(56) References Cited

U.S. PATENT DOCUMENTS

2017/0121843 A1* 5/2017 Plummer ................ C30B 29/02

FOREIGN PATENT DOCUMENTS

| TW | 202238765 | 10/2022 |
|---|---|---|
| TW | 202310166 | 3/2023 |

OTHER PUBLICATIONS

"Office Action of Taiwan Counterpart Application", issued on Jan. 9, 2024, pp. 1-6.

(Continued)

*Primary Examiner* — Herve-Louis Y Assouman
(74) *Attorney, Agent, or Firm* — J.C. PATENTS

(57) ABSTRACT

A semiconductor chip including a semiconductor substrate and an interconnect structure is provided. The semiconductor substrate includes semiconductor devices. The interconnect structure is disposed on the semiconductor substrate and electrically connected to the semiconductor devices. The semiconductor substrate or the interconnect structure includes at least one conductor, which includes a first conductive part and a second conductive part connected to the first conductive part. The first conductive part includes randomly oriented metal, and the second conductive part includes oriented metal. A bonding structure including the above-mentioned semiconductor chip and a fabricating method for fabricating the above-mentioned semiconductor chip are also provided.

20 Claims, 21 Drawing Sheets

(56) References Cited

OTHER PUBLICATIONS

Hisin-Yong Liu et al., "Grain growth of (111) nanotwined Cu on (100)-oriented Cu films," 2016 11th International Microsystems, Packaging, Assembly and Circuits Technology Conference (IMPACT), Oct. 2016, pp. 45-47.
Bo Hong et al., "Influence of complexing agents on texture formation of electrodeposited copper," Surface & Coatings Technology, Feb. 2007, pp. 7449-7452.
Min Zhang et al., "Protrusion of Through-Silicon-Via (TSV) Copper with Double Annealing Processes," Journal of Electronic Materials, Feb. 2022, pp. 1-18.
Jia-Juen Ong et al., "Low-Temperature Cu/SiO2 Hybrid Bonding with Low Contact Resistance Using (111)-Oriented Cu Surfaces," Materials, Mar. 2022, pp. 1-11.
Mathieu César et al., "Calculated Resistances of Single Grain Boundaries in Copper," Physical Review Applied, Oct. 2014, pp. 1-11.
Chien-Min Liu et al., "Low-temperature direct copper-to-copper bonding enabled by creep on highly (1 1 1)-oriented Cu surfaces," Scripta Materialia, Jan. 2014, pp. 65-68.

* cited by examiner

BONDING STRUCTURE, SEMICONDUCTOR CHIP AND FABRICATING METHOD THEREOF

BACKGROUND

Technical Field

The disclosure relates to a semiconductor chip and a fabricating method thereof, and more particularly relates to a semiconductor chip in a bonding structure and a fabricating method thereof.

Description of Related Art

The interconnect technology is a medium for communication between chips. The traditional wire bonding technology, flip-chip packaging technology, micro-bump technology, through silicon via (TSV), redistribution layer (RDL), silicon bridge chip, etc. meet the needs of continuous improvement of chip performance. However, to keep up with the trend toward higher-density integration of chips, the hybrid bonding technology has become a new solution. As high-performance computing (HPC) chips continue to raise the requirements for performance and packaging density, the micro-bump technology may meet the requirements of 3D packaging of high-performance computing chips. However, in the face of the trend of more input/output pins and lower power consumption, the hybrid bonding technology is advantageous in reducing the bond pitch, improving the input/output pin density and bandwidth density, and reducing power consumption, and thus has gradually become the focus of research and development in the packaging industry.

SUMMARY

Exemplary embodiments of the disclosure provide a semiconductor chip and a fabricating method thereof, which reduce the contact resistance with use of oriented metal when semiconductor chips are bonded to each other. Furthermore, the use of oriented metal facilitates the low temperature bonding of the semiconductor chips.

An exemplary embodiment of the disclosure provides a semiconductor chip including a semiconductor substrate and an interconnect structure. The semiconductor substrate includes a plurality of semiconductor devices. The interconnect structure is disposed on the semiconductor substrate and electrically connected to the semiconductor devices. The semiconductor substrate or the interconnect structure includes at least one conductor which includes a first conductive part and a second conductive part connected to the first conductive part. The first conductive part includes randomly oriented metal and the second conductive part includes oriented metal.

Another exemplary embodiment of the disclosure provides a bonding structure including a first semiconductor chip and a second semiconductor chip. The first semiconductor chip includes a plurality of first conductors. The first conductor includes a first conductive part and a second conductive part connected to the first conductive part. The first conductive part includes randomly oriented metal and the second conductive part includes oriented metal. The second semiconductor chip is stacked on the first semiconductor chip and includes a plurality of second conductors. The second conductor includes a third conductive part and a fourth conductive part connected to the third conductive part. The third conductive part includes randomly oriented metal and the fourth conductive part includes oriented metal. The second conductive part and the fourth conductive part are bonded to each other.

Yet another exemplary embodiment of the disclosure provides a fabricating method for fabricating a semiconductor chip, which includes the following. A plurality of semiconductor devices are formed in a semiconductor substrate. An interconnect structure is formed on the semiconductor substrate, and the interconnect structure is electrically connected to the semiconductor devices. The semiconductor substrate or the interconnect structure includes at least one conductor. A forming method for forming the at least one conductor includes the following. A randomly oriented metal portion is formed in the semiconductor substrate or the interconnect structure. An oriented metal layer is formed on the semiconductor substrate or the interconnect structure to cover the randomly oriented metal portion. A thermal annealing process is performed to transform a part of the randomly oriented metal portion, which is in contact with the oriented metal layer, into an oriented metal portion.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
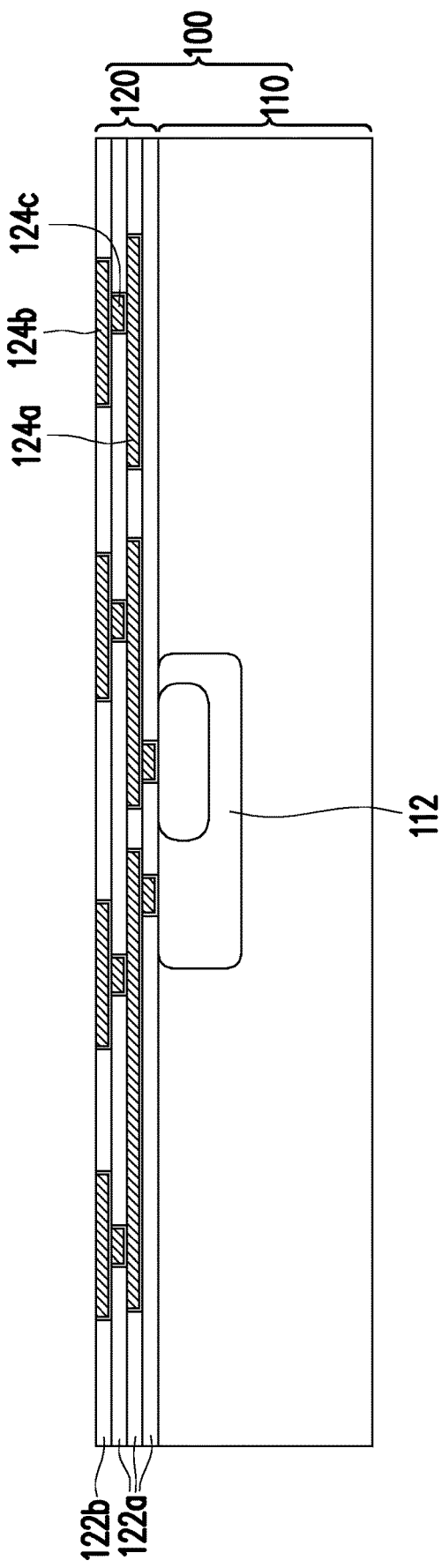
FIG. 1 to FIG. 9 are schematic diagrams showing the fabricating processes of a semiconductor chip according to the first embodiment of the disclosure.

Exemplary embodiments will be described in detail hereinafter with reference to the accompanying drawings, but these exemplary embodiments are not intended to limit the scope of the disclosure. In addition, the drawings are for illustration only and may not be drawn to scale. In order to facilitate understanding of the disclosure, the same elements will be given the same reference numerals in the following description. In addition, terms such as "comprising," "including," and "having" used in the specification are all open-ended terms, which mean "including but not limited to." Furthermore, the directional terms mentioned in the specification such as "up" and "down" are only used to refer to the directions of the drawings, and are not used to limit the disclosure. In addition, the numbers and shapes mentioned in the specification are only used to specifically illustrate the disclosure to facilitate understanding of the content rather than to limit the disclosure.

FIG. 1 to FIG. 9 are schematic diagrams showing the fabricating processes of a semiconductor chip according to the first embodiment of the disclosure.

Referring to FIG. 1, a semiconductor wafer 100 is provided. The semiconductor wafer 100 includes a semiconductor substrate 110 and an interconnect structure 120. The interconnect structure 120 is disposed on the semiconductor substrate 110, and the interconnect structure 120 is electrically connected to a semiconductor device 112 in the semiconductor substrate 110. In some embodiments, the semiconductor substrate 110 in the semiconductor wafer 100 includes a group IV semiconductor substrate (for example, a silicon substrate), a group III-V semiconductor substrate or a substrate of other materials. The semiconductor device 112 in the semiconductor substrate 110 includes active devices such as transistors (for example, CMOS field effect transistors) and/or passive devices such as resistors, capacitors, and inductors formed in the semiconductor substrate 110. The interconnect structure 120 includes a plurality of dielectric layers 122a and 122b stacked on the semiconductor substrate 110, a plurality of layers of interconnect wires 124a and 124b embedded in the dielectric layers 122a and 122b, and a plurality of conductive vias 124c. The semiconductor device 112 in the semiconductor substrate 110 is fabricated by front end of line (FEOL), and the dielectric layers 122a and 122b, the interconnect wires 124a and 124b, and the conductive vias 124c in the interconnect structure 120 are fabricated by back end of line (BEOL).

As shown in FIG. 1, the interconnect wire 124a is embedded in the dielectric layer 122a, the interconnect wire 124b and the conductive via 124c are embedded in the dielectric layer 122b, the interconnect wires 124a and 124b are electrically connected to each other through the conductive via 124c, the interconnect wire 124a and the active device 112 are electrically connected to each other through the conductive via 124c, and the upper surface of the interconnect wire 124b is not covered by the dielectric layer 122b. In some embodiments, the upper surface of the interconnect wire 124b is substantially coplanar with the upper surface of the dielectric layer 122b, and the upper surface of the interconnect wire 124b is exposed by the dielectric layer 122b. For example, the material of the dielectric layers 122a and 122b in the interconnect structure 120 includes SiO$_2$, SiON, SiN, SiC, SiCN, a polymer material or other insulating materials, the material of the interconnect wires 124a and 124b includes copper, gold, silver, cobalt or other metal, and the material of the conductive via 124c includes copper, gold, silver, cobalt or other metal. In addition, the aforementioned interconnect wires 124a and 124b may be a single metal layer or multiple metal layers.

Figure 2:
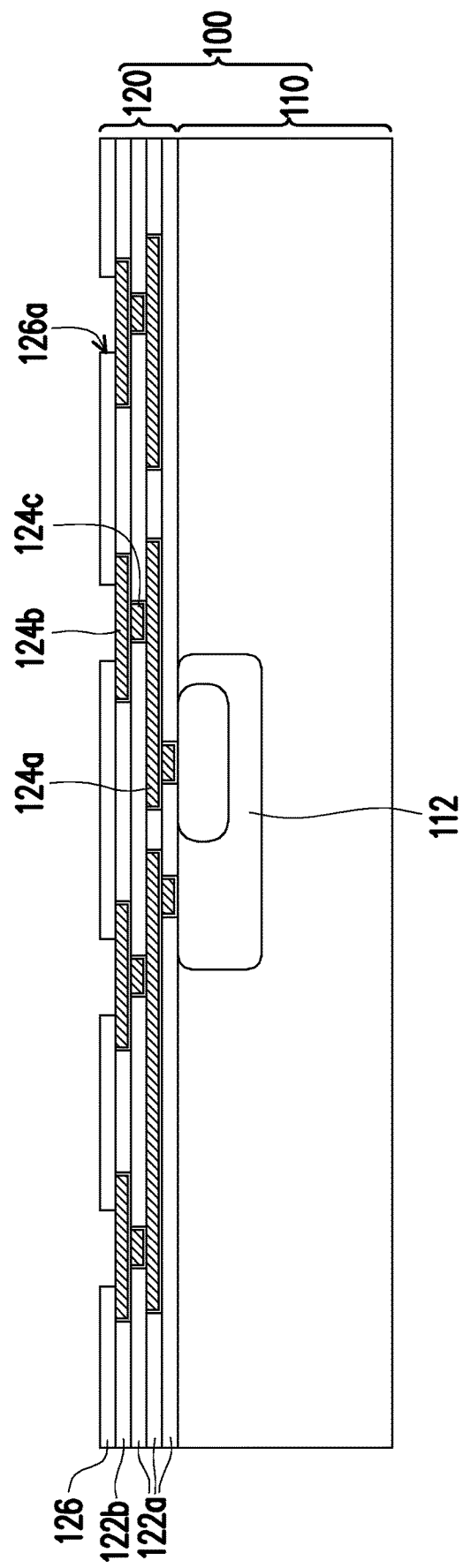

Referring to FIG. 2, a bonding dielectric layer 126 is formed on the dielectric layer 122b and the interconnect wire 124b. The bonding dielectric layer 126 covers the upper surface of the dielectric layer 122b and a part of the upper surface of the interconnect wire 124b, and the bonding dielectric layer 126 has a plurality of openings 126a to respectively expose a part of the upper surface of the interconnect wire 124b. In this embodiment, the material of the bonding dielectric layer 126 includes SiO$_2$, SiON, SiN, SiC, SiCN, a polymer material or other insulating materials. In addition, a patterning process of the bonding dielectric layer 126 may include a photolithographic etching process or other thin film patterning processes.

Figure 3:
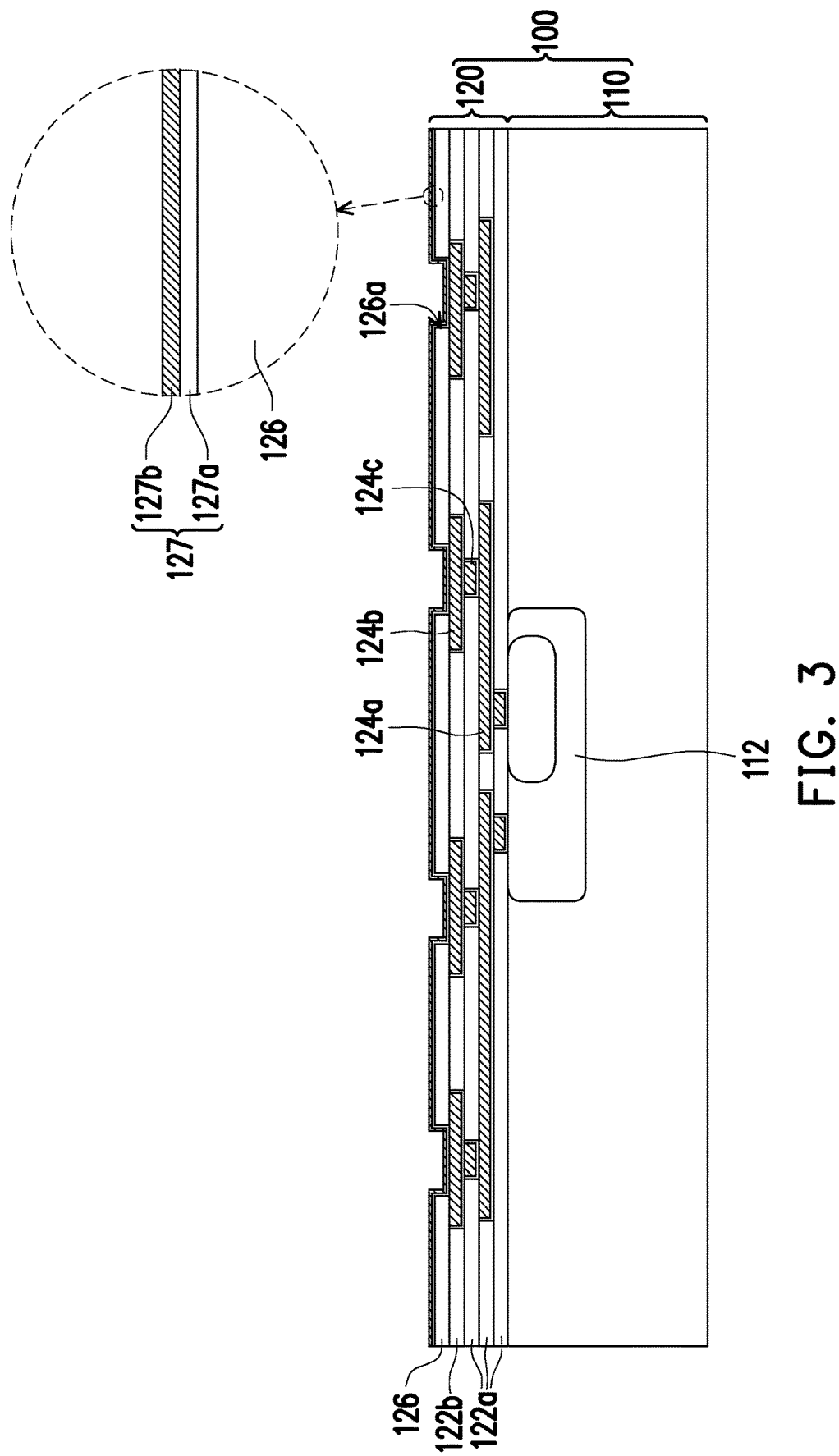

Referring to FIG. 3, a seed layer 127 is conformally formed on the bonding dielectric layer 126 and the interconnect wire 124b exposed by the opening 126a. The seed layer 127 covers the upper surface of the bonding dielectric layer 126, the sidewall of the opening 126a, and the upper surface of the interconnect wire 124b exposed by the opening 126a. In this embodiment, the seed layer 127 includes a bottom seed layer 127a and a top seed layer 127b. The bottom seed layer 127a may be in direct contact with the upper surface of the bonding dielectric layer 126 and the upper surface of the interconnect wire 124b exposed by the opening 126a, and the top seed layer 127b covers the bottom seed layer 127a and is in direct contact with the bottom seed layer 127a. In other words, the top seed layer 127b is separated from the bonding dielectric layer 126 and the interconnect wire 124b by the bottom seed layer 127a. For example, the bottom seed layer 127a of the seed layer 127 includes a titanium layer, a titanium nitride layer, a tantalum layer, a tantalum nitride layer, a cobalt layer, a molybdenum layer, a chromium layer, a manganese layer or other metal materials having a barrier function formed by a sputtering process. The top seed layer 127b of the seed layer 127 includes a copper layer formed by a sputtering process or other metal materials that have good adhesion properties with subsequently formed metal materials. For example, the thickness of the bottom seed layer 127a is about 20 angstroms to about 500 angstroms, and the thickness of the top seed layer 127b is about 20 angstroms to about 500 angstroms.

Figure 4:
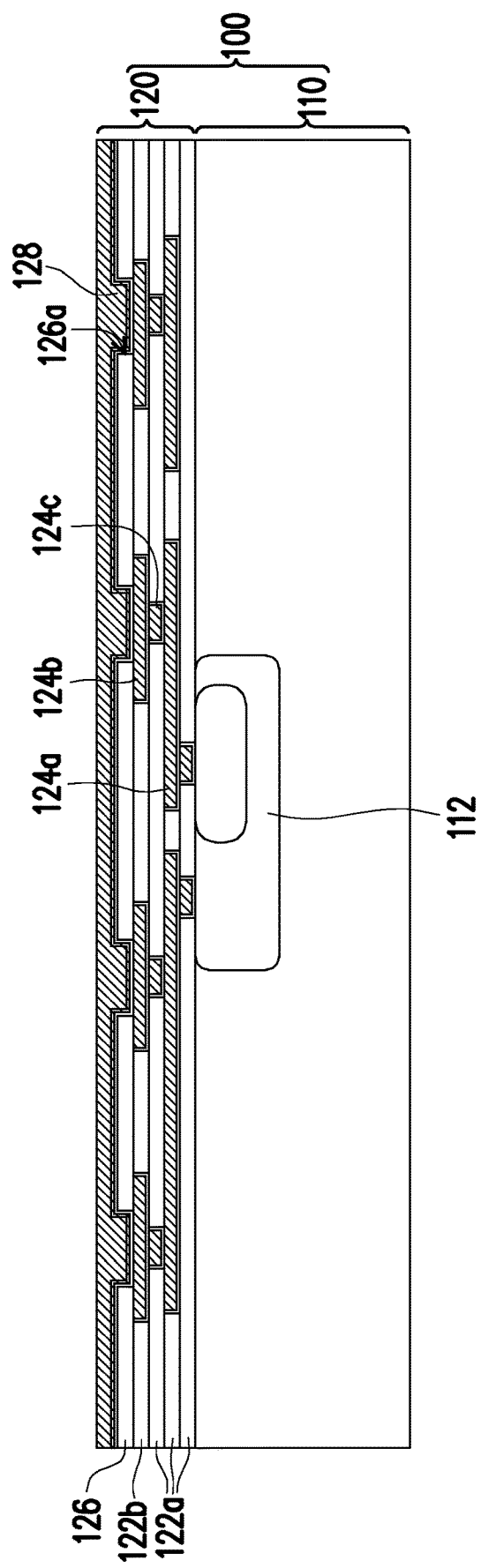

Referring to FIG. 4, a conductive material layer 128 is formed on the seed layer 127, and the conductive material layer 128 covers the seed layer 127 and is in direct contact with the top seed layer 127b. In some embodiments, the conductive material layer 128 is formed by an electroplating process. The conductive material layer 128 has a thickness sufficient to fill the opening 126a of the bonding dielectric layer 126, and the conductive material layer 128 has a substantially flat upper surface. In this embodiment, the conductive material layer 128 includes a randomly oriented metal layer formed by an electroplating process, such as a randomly oriented copper layer, a randomly oriented gold layer, a randomly oriented silver layer, and a randomly oriented cobalt layer.

Figure 5:
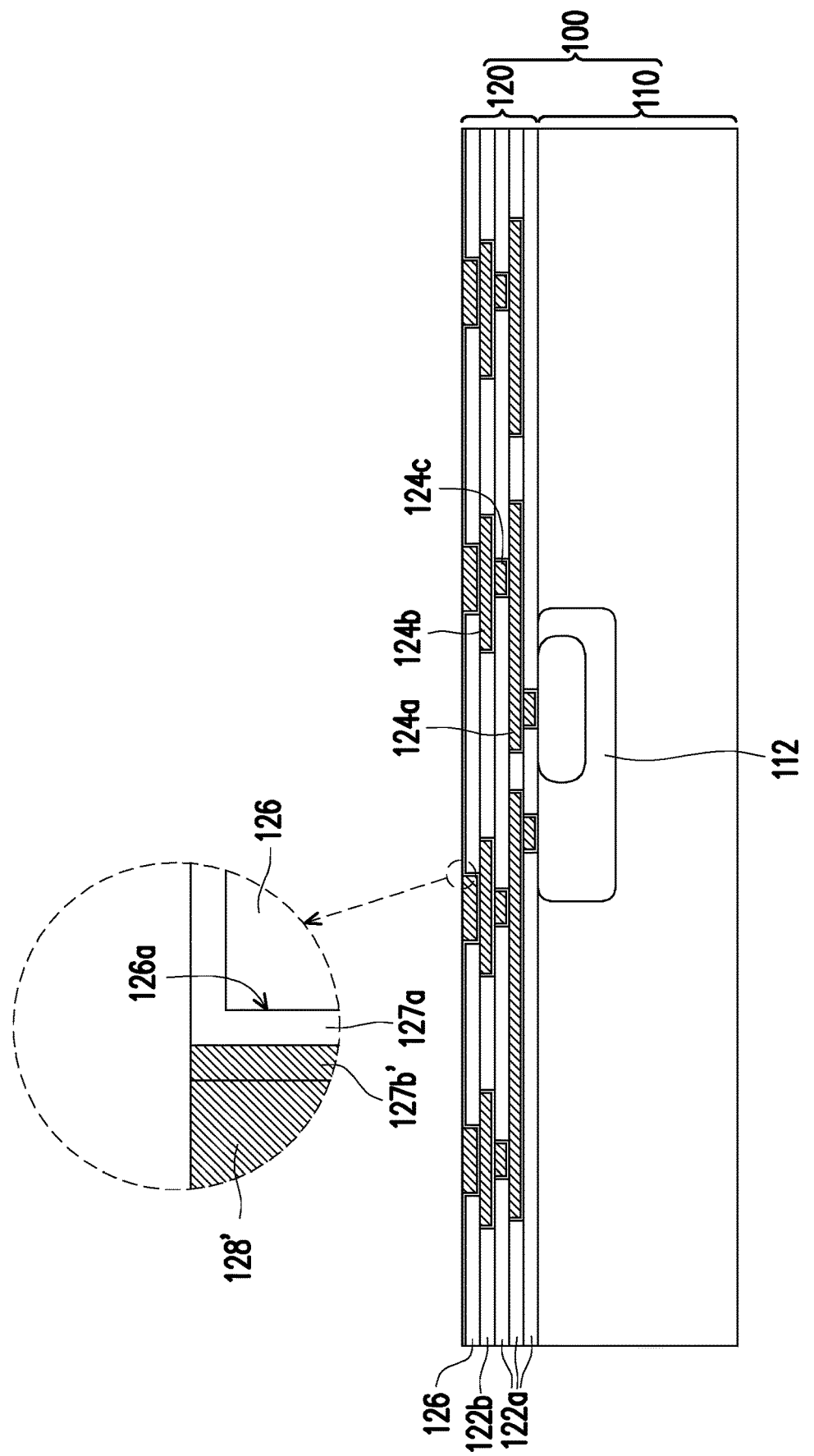

Referring to FIG. 4 and FIG. 5, after the conductive material layer 128 is formed, a part of the conductive material layer 128 and a part of the top seed layer 127b are removed to form a top seed layer 127b' and a bonding conductor 128' in the opening 126a of the bonding dielectric layer 126. The top seed layer 127b' is laterally distributed between the bonding conductor 128' and the bonding dielectric layer 126. In this embodiment, a chemical mechanical polishing process is performed to remove a part of the conductive material layer 128 located outside the opening 126a and a part of the top seed layer 127b covering the bottom seed layer 127a. After the chemical mechanical polishing process is performed, the bottom seed layer 127a is not removed and the upper surface of the bottom seed layer 127a is exposed, and the top seed layer 127b' is laterally distributed between the bottom seed layer 127a and the bonding conductor 128'. Here, the bottom seed layer 127a may serve as a polishing stop layer during the removal process of the conductive material layer 128 and the top seed layer 127b.

In some embodiments, due to polishing selectivity and/or polishing loading effect, the bonding conductor 128' has a slightly recessed upper surface, but the slightly recessed upper surface does not affect subsequent processes (for example, subsequent deposition process).

Figure 6:
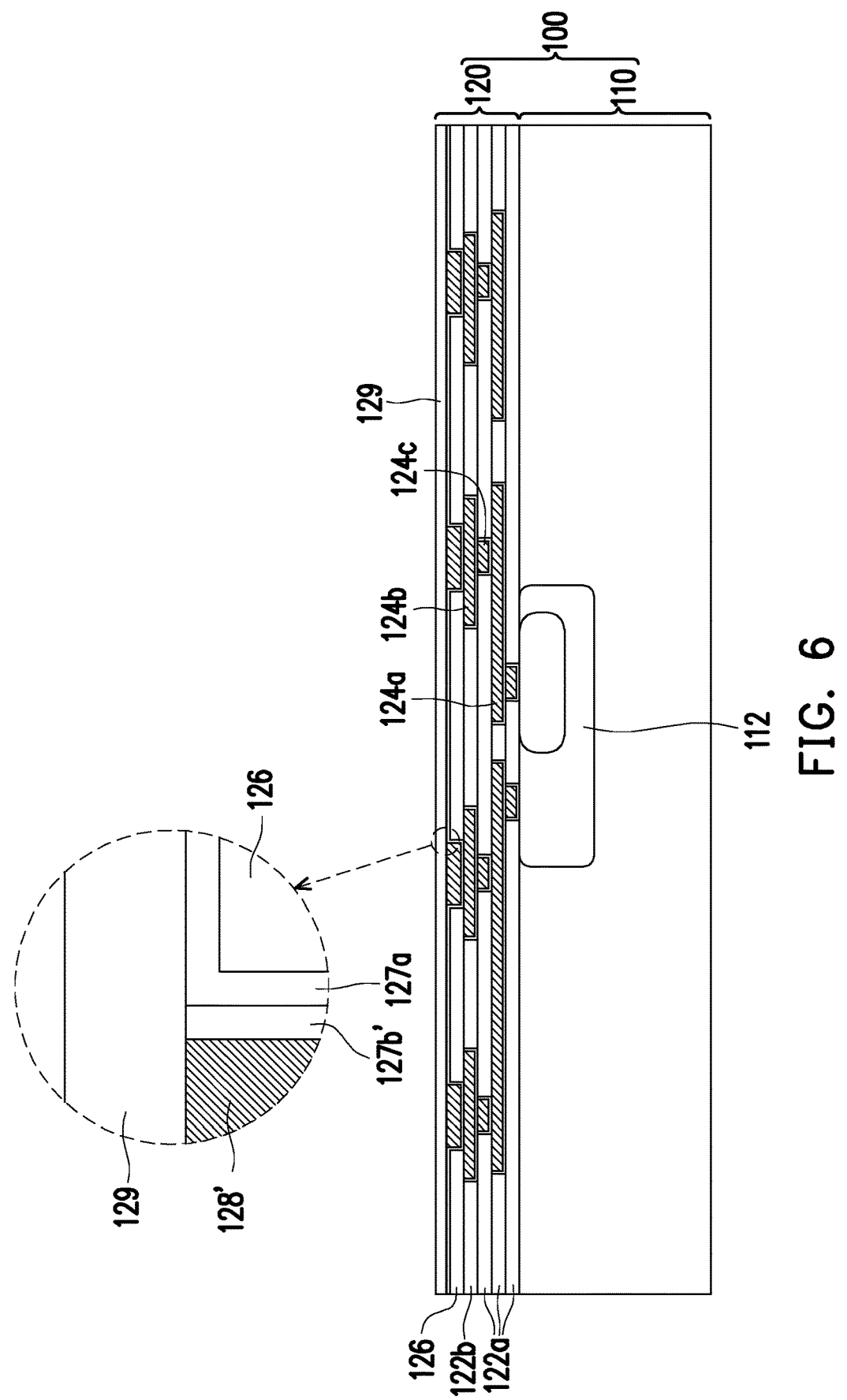

Referring to FIG. 6, a (111)-oriented metal material layer 129 is formed on the bottom seed layer 127a, the top seed layer 127b', and the bonding conductor 128'. The (111)-oriented metal material layer 129 is in direct contact with the upper surface of the bottom seed layer 127a, the top end of the top seed layer 127b', and the upper surface of the bonding conductor 128'. In this embodiment, the (111)-oriented metal material layer 129 includes a (111)-oriented copper layer, a (111)-oriented gold layer, a (111)-oriented silver layer, a (111)-oriented cobalt layer, etc. formed by epitaxial growth. In some embodiments, the (111)-oriented metal material layer 129 is a nano-twinned copper layer, a nano-twinned gold layer, a nano-twinned silver layer, a nano-twinned cobalt layer, a monocrystal copper layer, a monocrystal gold layer, a monocrystal silver layer or a monocrystal cobalt layer formed by epitaxial growth.

Figure 7:
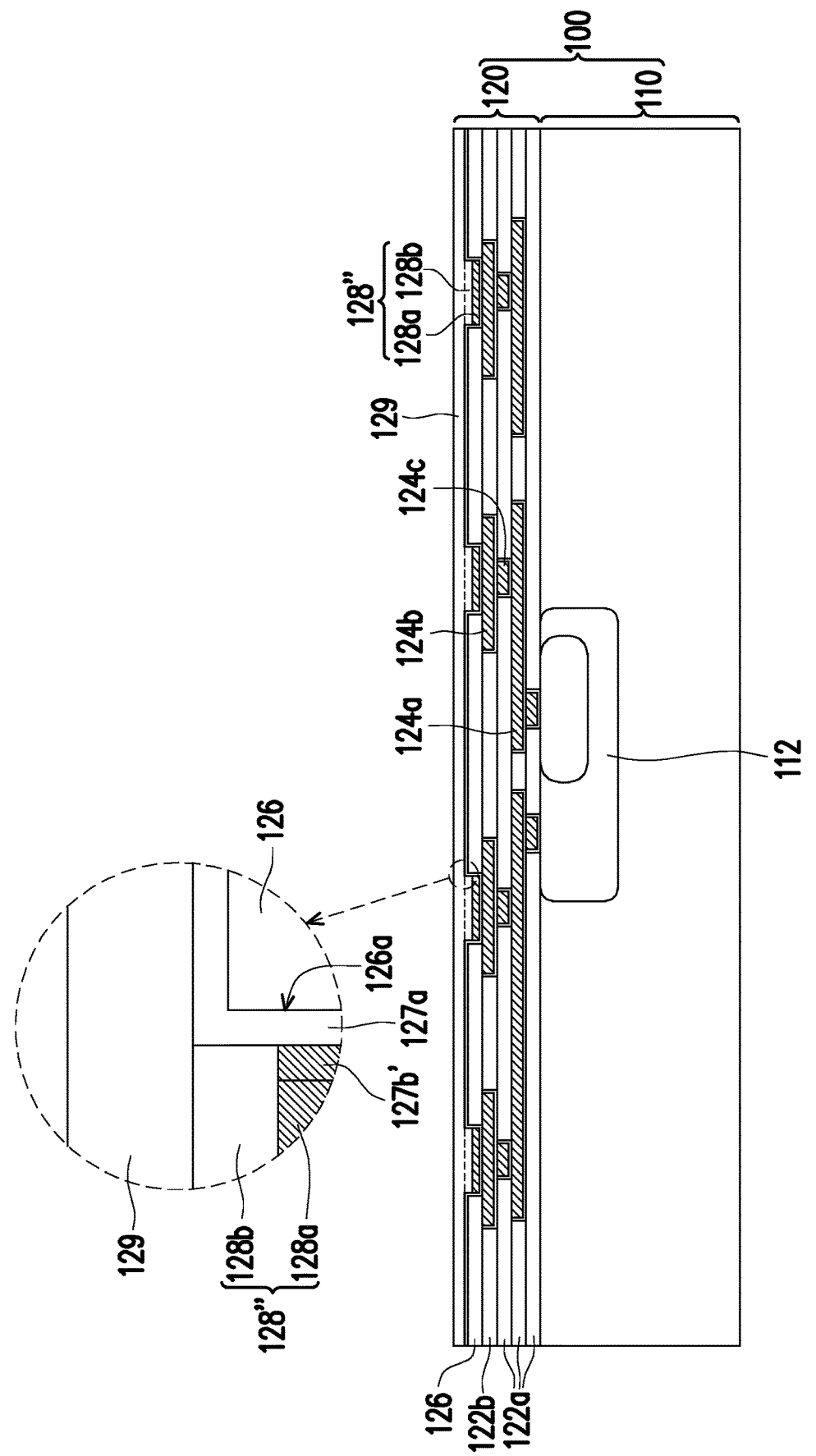

Referring to FIG. 6 and FIG. 7, an annealing process is performed on the (111)-oriented metal material layer 129 to transform a part of the bonding conductor 128' (that is, the part of the bonding conductor 128', which is in direct contact with the (111)-oriented metal material layer 129) into a (111)-oriented metal portion 128a. After the annealing process of the (111)-oriented metal material layer 129 is completed, annealed (111)-oriented metal grains such as (111)-oriented copper grains are epitaxially grown downward to transform the top portion of the bonding conductor 128' to the same (111)-orientation as the (111)-oriented metal material layer 129, so that the bonding conductor 128' is transformed into a bonding conductor 128" having different conductive parts 128a and 128b. After the annealing process of the (111)-oriented metal material layer 129 is performed, the bonding conductor 128" includes the first conductive part 128a and the second conductive part 128b located between the first conductive part 128a and the (111)-oriented metal material layer 129. The first conductive part 128a is a randomly oriented metal portion and the second conductive part 128b is a (111)-oriented metal portion. For example, the thickness of the second conductive part 128b is about 10 angstroms to about 500 angstroms.

In some embodiments, after the annealing process of the (111)-oriented metal material layer 129 is performed, the top end of the top seed layer 127b' that was originally randomly oriented may also be transformed into (111)-oriented metal. In addition, as shown in FIG. 7, the bottom seed layer 127a laterally covers the first conductive part 128a and the second conductive part 128b, and a part of the surface of the second conductive part 128b is not covered by the barrier layer 127a.

Figure 8:
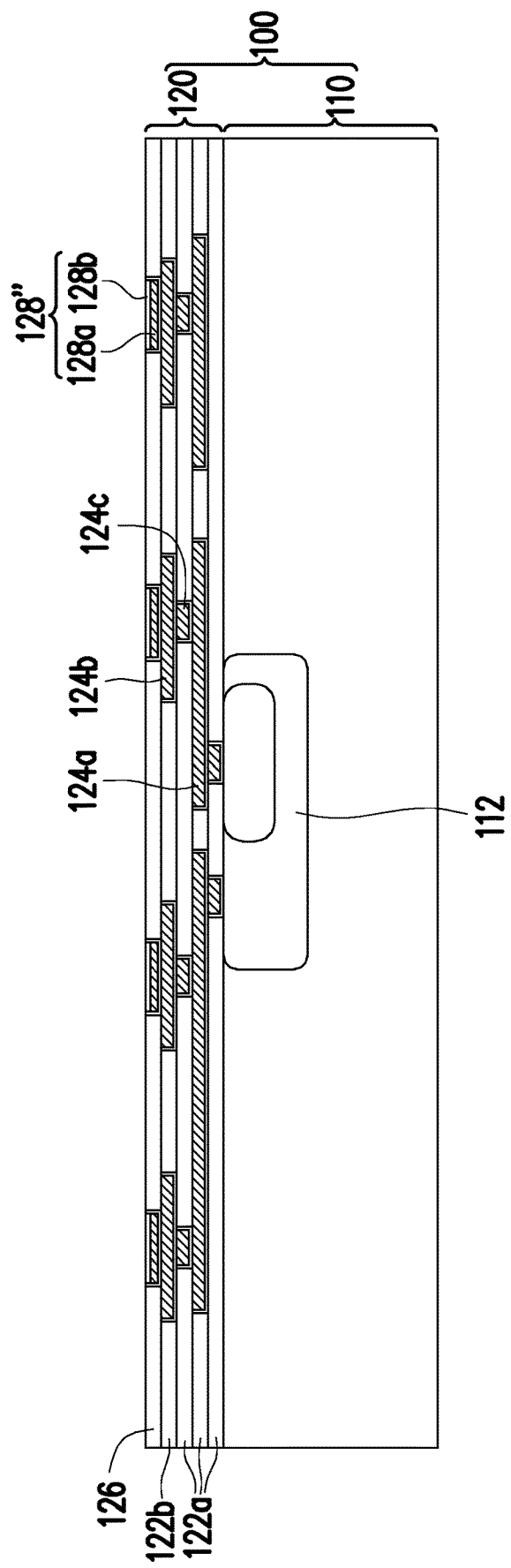

Referring to FIG. 7 and FIG. 8, after the bonding conductor 128" is formed, the (111)-oriented metal material layer 129 is removed to expose the upper surface of the second conductive part 128b. In this embodiment, a chemical mechanical polishing process is performed to form the bonding conductor 128", and the bottom seed layer 127a may serve as a polishing stop layer during the removal process of the (111)-oriented metal material layer 129. In some embodiments, due to polishing selectivity and/or polishing loading effect, the bonding conductor 128" has a slightly recessed upper surface, but the slightly recessed upper surface does not affect subsequent processes (for example, subsequent bonding process).

As shown in FIG. 8, after the bonding conductor 128" is completed, the preliminary fabrication of the semiconductor wafer 100 is completed. In this embodiment, the semiconductor wafer 100 includes the semiconductor substrate 110 and the interconnect structure 120. The semiconductor substrate 110 includes a plurality of semiconductor devices 112. The interconnect structure 120 is disposed on the semiconductor substrate 110 and electrically connected to the semiconductor devices 112. The interconnect structure 120 includes at least one bonding conductor 128", and the bonding conductor 128" includes the first conductive part 128a and the second conductive part 128b connected to the first conductive part 128a. The first conductive part 128a includes randomly oriented metal and the second conductive part 128b includes (111)-oriented metal.

Figure 9:
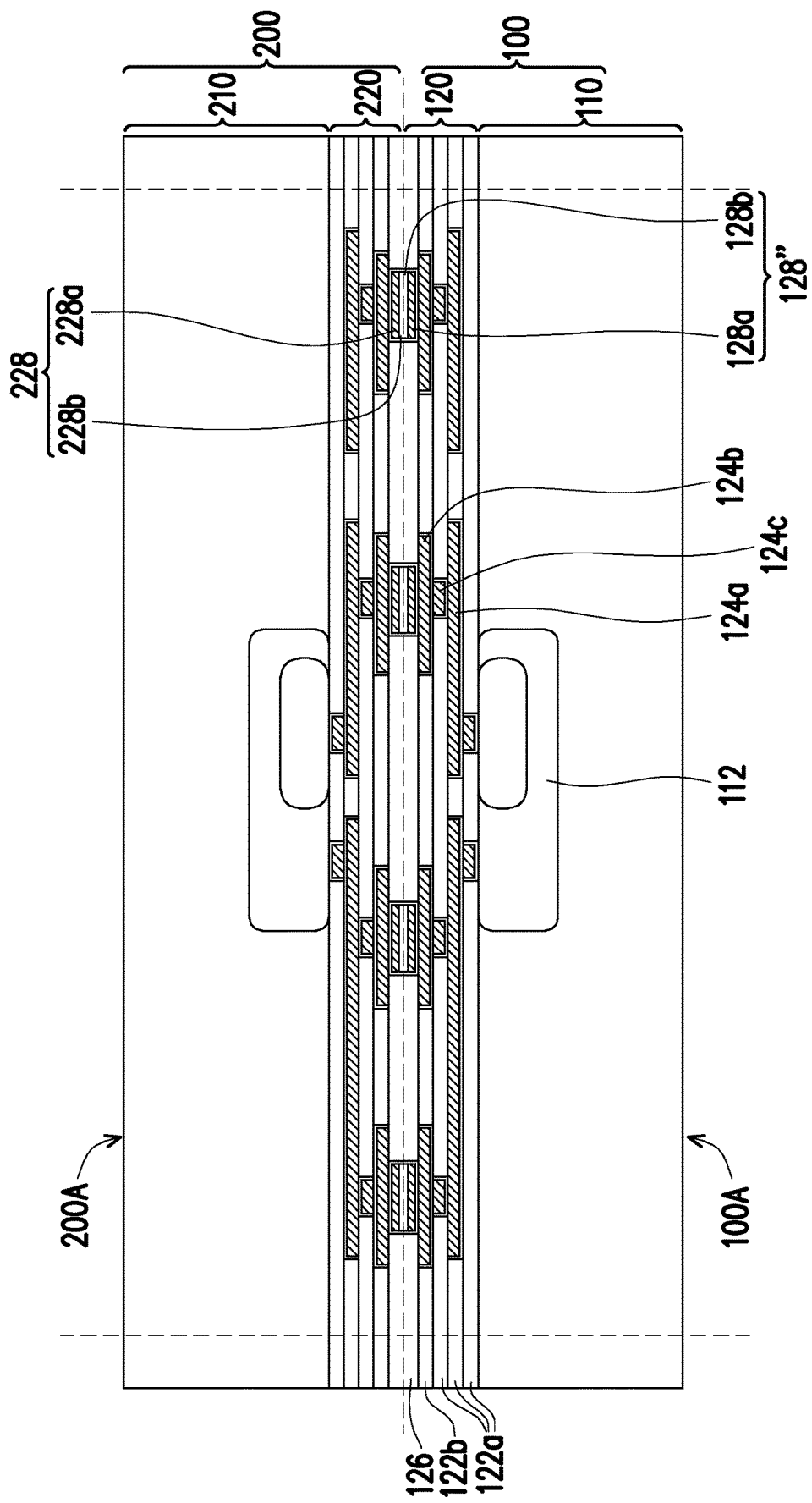

Referring to FIG. 9, a semiconductor wafer 200 is provided. The semiconductor wafer 200 is stacked on the semiconductor wafer 100, and a hybrid bonding process is performed to bond the interconnect structure 120 in the semiconductor wafer 100 and an interconnect structure 220 in the semiconductor wafer 200 to each other. In this embodiment, the semiconductor wafer 200 includes a semiconductor substrate 210 and the interconnect structure 220 disposed on the semiconductor substrate 210. As shown in FIG. 9, the semiconductor wafer 200 and the semiconductor wafer 100 have similar structures, and the semiconductor wafer 200 and the semiconductor wafer 100 are stacked in a face-to-face manner. That is, the interconnect structure 120 in the semiconductor wafer 100 is bonded to the interconnect structure 220 in the semiconductor wafer 200, and the interconnect structure 120 and the interconnect structure 220 are located between the semiconductor substrate 110 in the semiconductor wafer 100 and the semiconductor substrate 210 in the semiconductor wafer 200. However, in alternative embodiments, the semiconductor wafer 200 and the semiconductor wafer 100 are stacked in a face-to-back manner. In this embodiment, the bonding interface between the semiconductor wafer 100 and the semiconductor wafer 200 is a hybrid bonding interface, and the hybrid bonding interface includes a dielectric-to-dielectric bonding interface, a dielectric-to-metal bonding interface and a metal-to-metal bonding interface.

As shown in FIG. 9, the semiconductor wafer 200 is stacked on the semiconductor wafer 100, and the semiconductor wafer 100 and the semiconductor wafer 200 are bonded to each other by a wafer-to-wafer hybrid bonding process. In some other embodiments, not shown in the drawings, a plurality of semiconductor chips may be disposed in the semiconductor wafer 100, and a hybrid bonding process may be performed so that the interconnect structure 120 in the semiconductor wafer 100 and the interconnect structure in the semiconductor chip are bonded to each other by a chip-to-wafer hybrid bonding process.

After the aforementioned wafer-to-wafer hybrid bonding process or chip-to-wafer hybrid bonding process is performed, a wafer cutting process may be further performed on the semiconductor wafer 100 to form a plurality of singulated bonding structures (that is, the structures between the two dotted lines). The aforementioned singulated bonding structure includes a first semiconductor chip 100A and a second semiconductor chip 200A. The first semiconductor chip 100A includes a plurality of first conductors 128", and the first conductor 128" include a first conductive part 128a and a second conductive part 128b connected to the first conductive part 128a. The first conductive part 128a includes randomly oriented metal and the second conductive part 128b includes (111)-oriented metal. The second semiconductor chip 200A is stacked on the first semiconductor chip 100A. The second semiconductor chip 200A includes a plurality of second conductors 228, and the second conductor 228 includes a third conductive part 228a and a fourth conductive part 228b connected to the third conductive part 228a. The third conductive part 228a includes randomly oriented metal and the fourth conductive part 228b includes (111)-oriented metal. The second conductive part 128b is bonded to the fourth conductive part 228b.

In some other feasible embodiments, not shown in the drawings, the semiconductor wafer 100 may be cut into a plurality of first semiconductor chips first, then the second semiconductor chip may be disposed on the first semiconductor chip, and a hybrid bonding process may be performed, so that the first interconnect structure in the first semiconductor chip and the second interconnect structure in the second semiconductor chip are bonded to each other by a chip-to-chip hybrid bonding process.

FIG. 10 to FIG. 19 are schematic diagrams showing the fabricating processes of a semiconductor chip according to the second embodiment of the disclosure.

Figure 10:
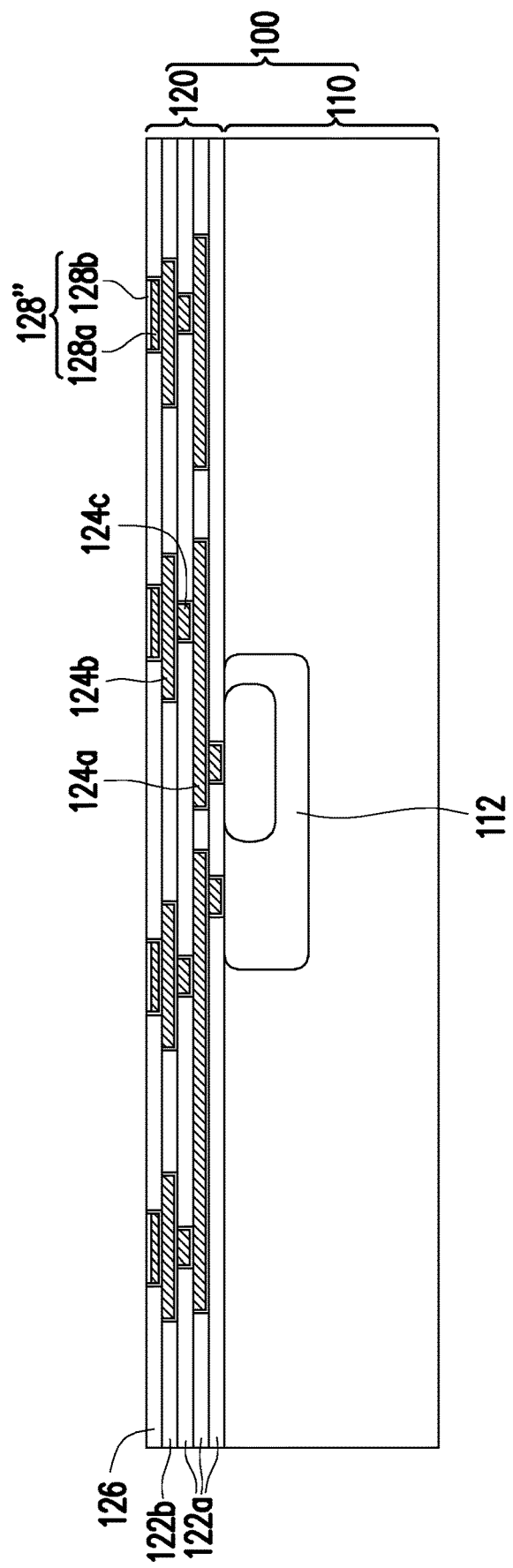
FIG. 10 to FIG. 19 are schematic diagrams showing the fabricating processes of a semiconductor chip according to the second embodiment of the disclosure.

Referring to FIG. 10, a semiconductor wafer 100 is provided. In this embodiment, the semiconductor wafer 100 includes a semiconductor substrate 110 and an interconnect structure 120. The semiconductor substrate 110 includes a plurality of semiconductor devices 112. The interconnect structure 120 is disposed on the semiconductor substrate 110 and electrically connected to the semiconductor devices 112. The interconnect structure 120 includes at least one bonding conductor 128", and the bonding conductor 128" includes a first conductive part 128a and a second conductive part 128b connected to the first conductive part 128a. The first conductive part 128a includes randomly oriented metal and the second conductive part 128b includes (111)-oriented metal.

Figure 11:
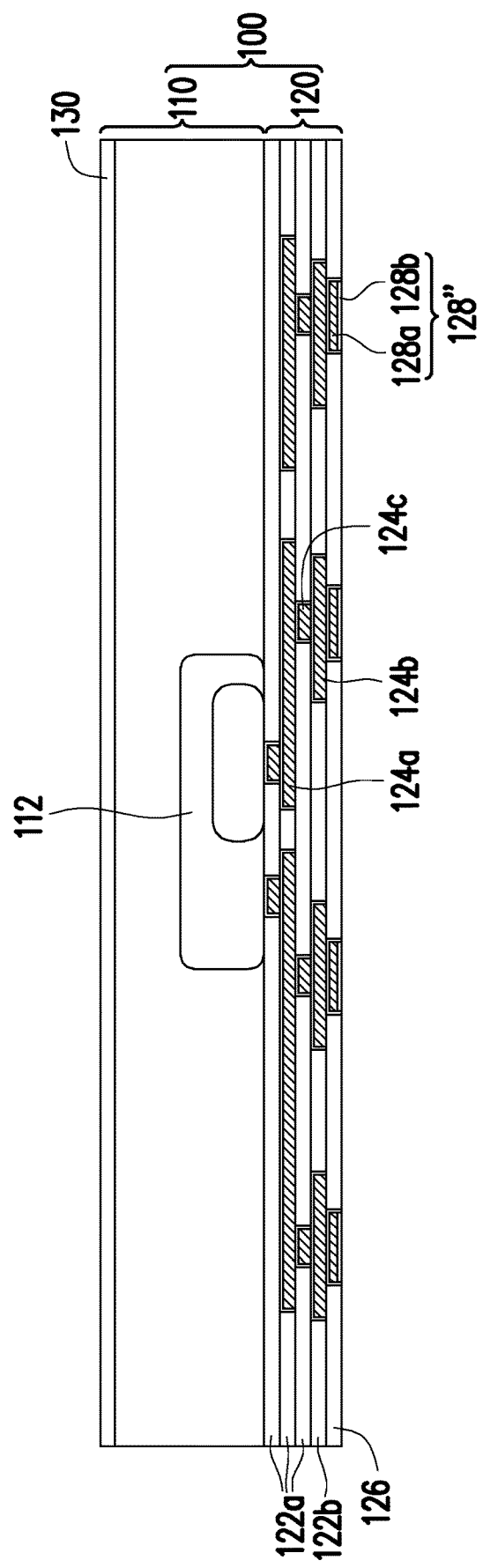

Referring to FIG. 10 and FIG. 11, the semiconductor wafer 100 is turned over, and a thinning process is performed from the back surface of the semiconductor wafer 100 to reduce the thickness of the semiconductor substrate 110. In some embodiments, the thinning process of the semiconductor substrate 110 includes a chemical mechanical polishing process, an etching process, a mechanical polishing process or a combination of the aforementioned processes. After the thinning process, a protective layer 130 is formed on the back surface of the semiconductor substrate 110. In this embodiment, the material of the protective layer 130 includes $SiO_2$, SiON, SiN, SiC, SiCN, a polymer material or other insulating materials.

Figure 12:
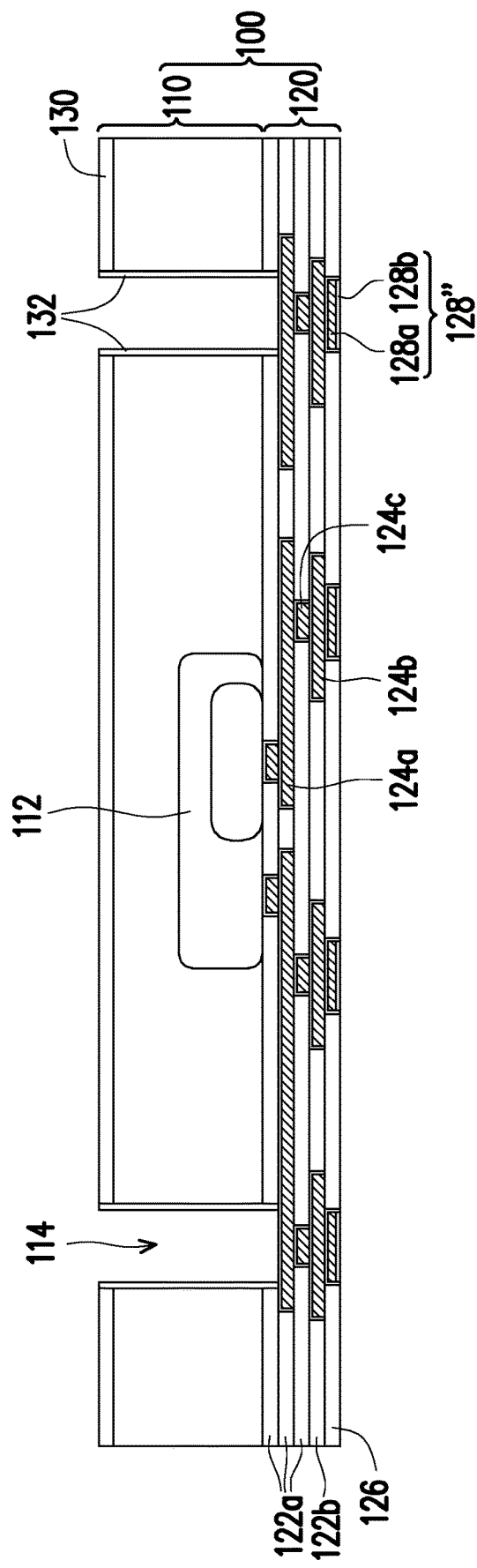

Referring to FIG. 11 and FIG. 12, a through hole 114 is formed in the semiconductor substrate 110, and the through hole 114 extends from the back surface of the semiconductor substrate 110 into the interconnect structure 120. In some embodiments, the through hole 114 is formed in the semiconductor substrate 110 by a photolithographic etching process. As shown in FIG. 12, in some embodiments, the through hole 114 may further extend through a dielectric layer 122a located between an interconnect wire 124a and the semiconductor substrate 110 to expose a part of the bottom surface of the interconnect wire 124a.

After the through hole 114 is formed, a sidewall protective layer 132 is formed on the sidewall of the through hole 114. In some embodiments, a dielectric material layer may be formed on the back surface of the semiconductor substrate 110 first, and the dielectric material layer conformally covers the protective layer 130, the sidewall of the through hole 114, and the interconnect wire 124a exposed by the through hole 114. Next, an etching process is performed to remove a part of the dielectric material layer until the interconnect wire 124a at the bottom of the through hole 114 is exposed, so as to form the sidewall protective layer 132. In some embodiments, during the process of removing the dielectric material layer at the bottom of the through hole 114, the dielectric material layer on the protective layer 130 is also removed.

As shown in FIG. 12, the top end of the sidewall protective layer 132 is in contact with the protective layer 130, and the bottom end of the sidewall protective layer 132 is in contact with the interconnect wire 124a below. Based on the above, the sidewall protective layer 132 and the protective layer 130 can provide a good insulating effect for the surface of the semiconductor substrate 110.

Figure 13:
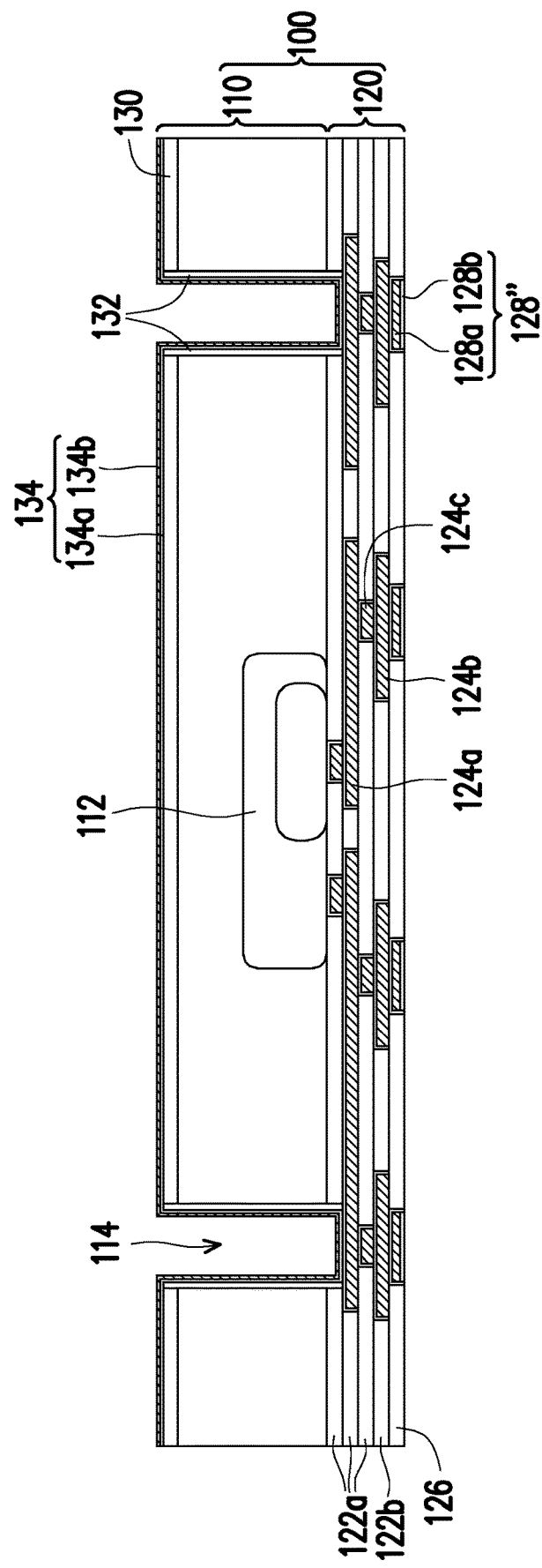

Referring to FIG. 13, a seed layer 134 is conformally formed on the sidewall protective layer 132, the protective layer 130, and the interconnect wire 124a exposed by the through hole 114. The seed layer 134 covers the upper surface of the protective layer 130, the side surface of the sidewall protective layer 132, and the bottom surface of the interconnect wire 124a exposed by the through hole 114. In this embodiment, the seed layer 134 includes a bottom seed layer 134a and a top seed layer 134b. The bottom seed layer 134a may be in direct contact with the upper surface of the protective layer 130 and the bottom surface of the interconnect wire 124a exposed by the through hole 114, and the top seed layer 134b may cover the bottom seed layer 134a and be in direct contact with the bottom seed layer 134a. In other words, the top seed layer 134b is separated from the protective layer 130, the sidewall protective layer 132, and the interconnect wire 124a by the bottom seed layer 134a. For example, the bottom seed layer 134a of the seed layer 134 includes a titanium layer, a titanium nitride layer, a tantalum layer, a tantalum nitride layer, a cobalt layer, a molybdenum layer, a chromium layer, a manganese layer or other metal materials having a barrier function formed by a sputtering process. The top seed layer 134b of the seed layer 134 includes a copper layer formed by a sputtering process or other metal materials that have good adhesion properties with subsequently formed metal materials. For example, the thickness of the bottom seed layer 134a is about 20 angstroms to about 500 angstroms, and the thickness of the top seed layer 134b is about 20 angstroms to about 500 angstroms.

Figure 14:
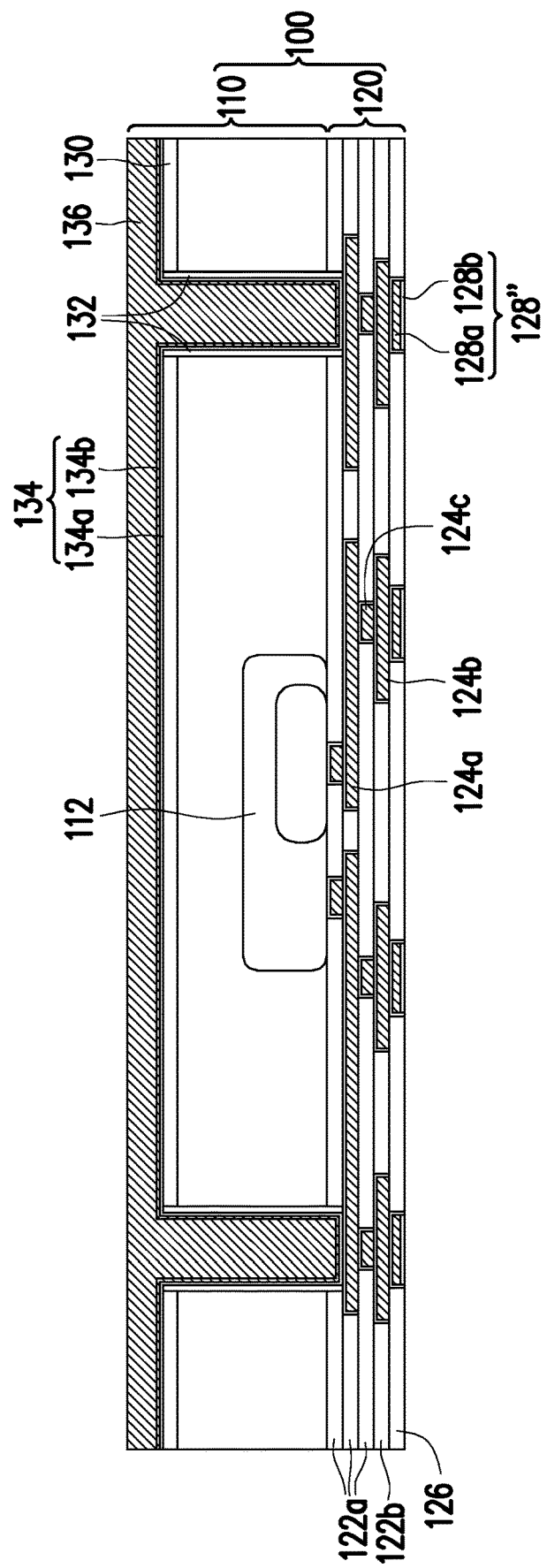

Referring to FIG. 14, a conductive material layer 136 is formed on the seed layer 134, and the conductive material layer 136 covers the seed layer 134 and is in direct contact with the top seed layer 134b in the seed layer 134. In some embodiments, the conductive material layer 136 is formed by an electroplating process. The conductive material layer 136 has a thickness sufficient to fill the through hole 114, and the conductive material layer 136 has a substantially flat upper surface. In this embodiment, the conductive material layer 136 includes a randomly oriented metal layer formed by an electroplating process, such as a randomly oriented copper layer, a randomly oriented gold layer, a randomly oriented silver layer, and a randomly oriented cobalt layer.

Figure 15:
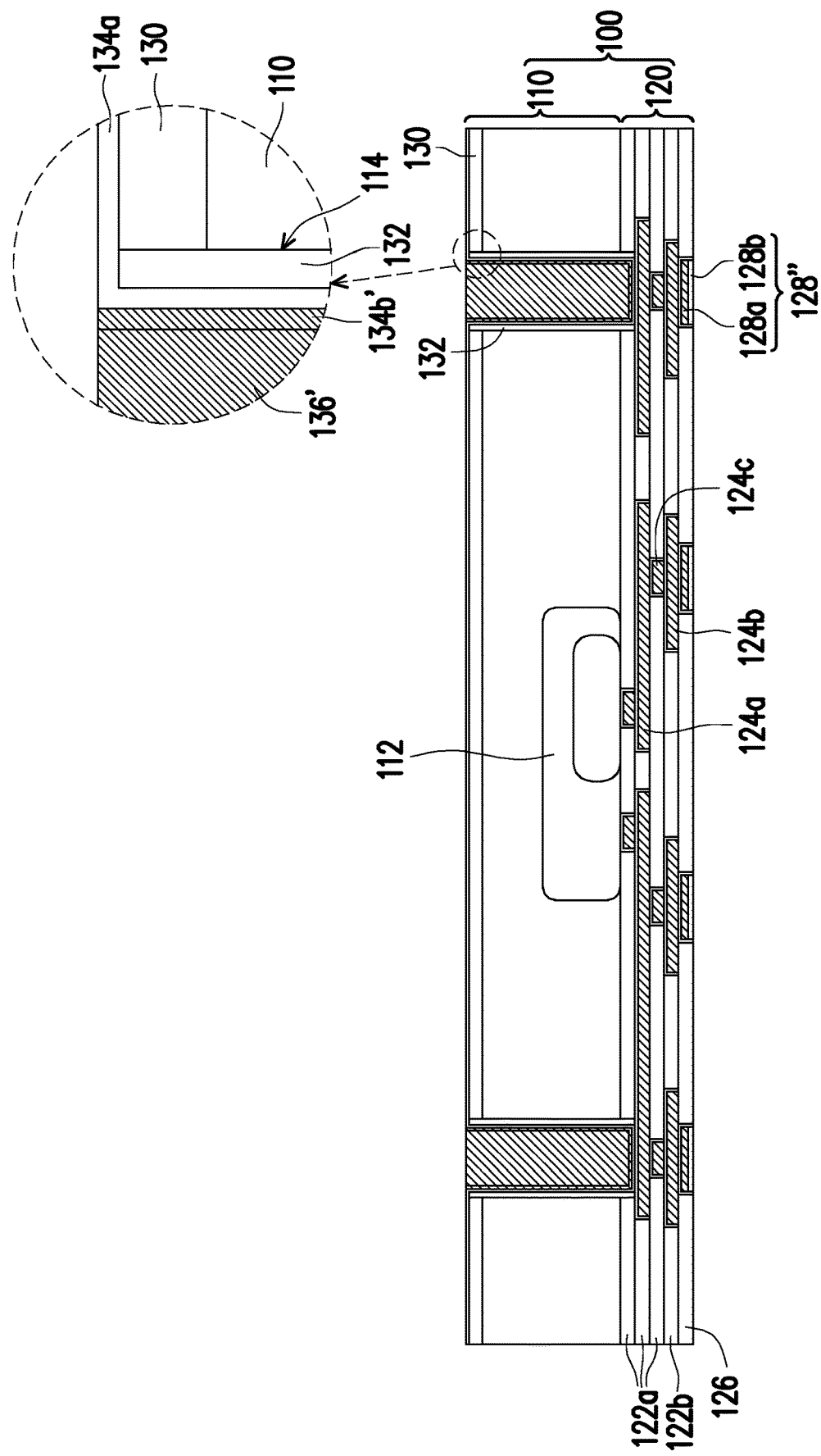

Referring to FIG. 14 and FIG. 15, after the conductive material layer 136 is formed, a part of the conductive material layer 136 and a part of the top seed layer 134b are removed to form a top seed layer 134b' and a conductive pillar 136' in the through hole 114. The top seed layer 134b' is laterally distributed between the conductive pillar 136' and the sidewall protective layer 132. In this embodiment, a chemical mechanical polishing process is performed to remove a part of the conductive material layer 136 outside the through hole 114 and a part of the top seed layer 134b covering the bottom seed layer 134a. After the chemical mechanical polishing process is performed, the bottom seed layer 134a is not removed and the upper surface of the bottom seed layer 134a is exposed, and the top seed layer 134b' is laterally distributed between the bottom seed layer 134a and the conductive pillar 136'. Here, the bottom seed layer 134a may serve as a polishing stop layer during the removal process of the conductive material layer 136 and the top seed layer 134b.

In some embodiments, due to polishing selectivity and/or polishing loading effect, the conductive pillar 136' has a slightly recessed upper surface, but the slightly recessed upper surface does not affect subsequent processes (for example, subsequent deposition process).

Figure 16:
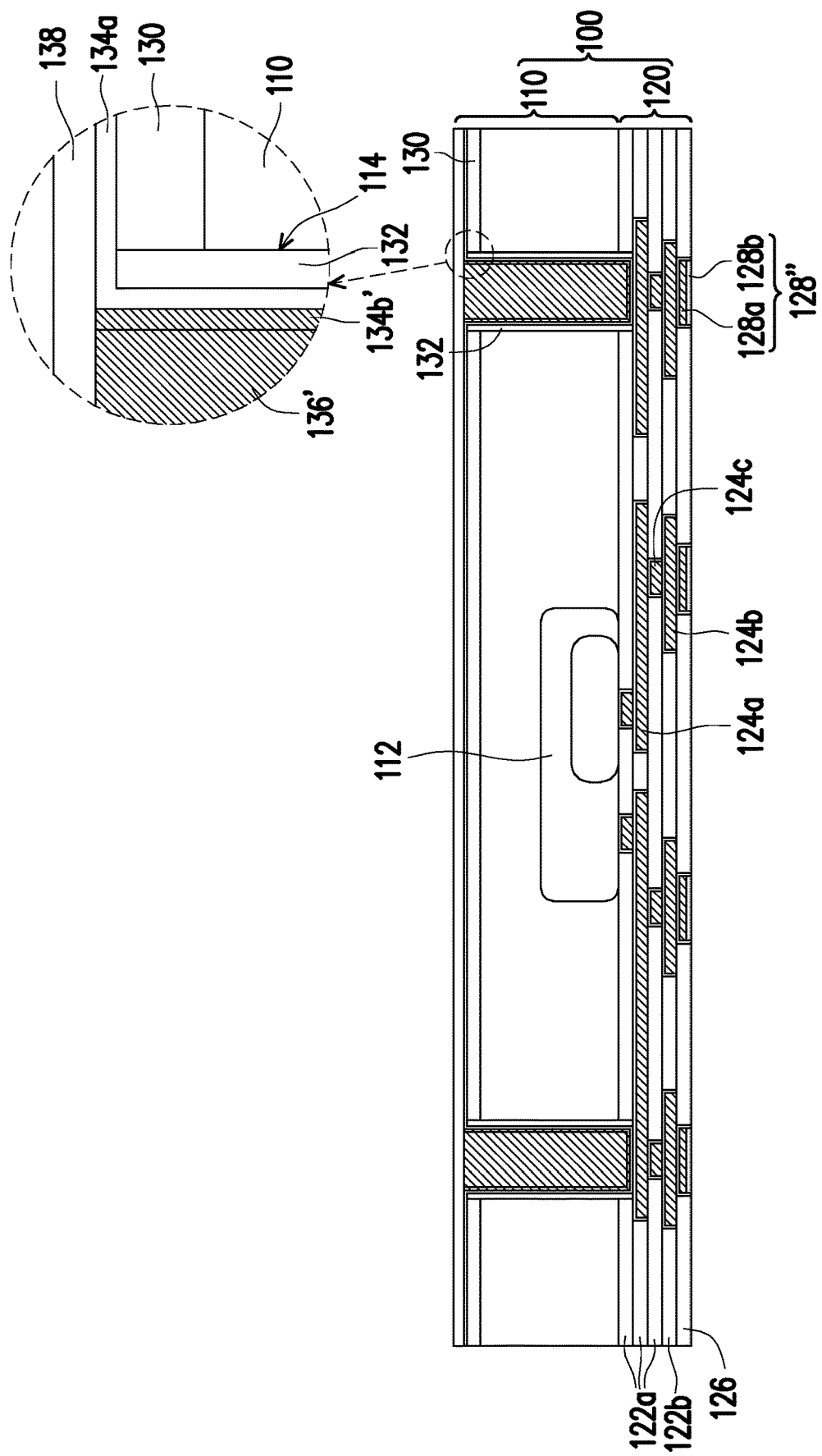

Referring to FIG. 16, a (111)-oriented metal material layer 138 is formed on the bottom seed layer 134a, the top seed layer 134b', and the conductive pillar 136'. The (111)-oriented metal material layer 138 is in direct contact with the upper surface of the bottom seed layer 134a, the top end of the top seed layer 134b', and the upper surface of the conductive pillar 136'. In this embodiment, the (111)-oriented metal material layer 138 includes a (111)-oriented copper layer, a (111)-oriented gold layer, a (111)-oriented silver layer, a (111)-oriented cobalt layer, etc. formed by epitaxial growth. In some embodiments, the (111)-oriented metal material layer 138 is a nano-twinned copper layer, a nano-twinned gold layer, a nano-twinned silver layer, a nano-twinned cobalt layer, a monocrystal copper layer, a monocrystal gold layer, a monocrystal silver layer or a monocrystal cobalt layer formed by epitaxial growth.

Figure 17:
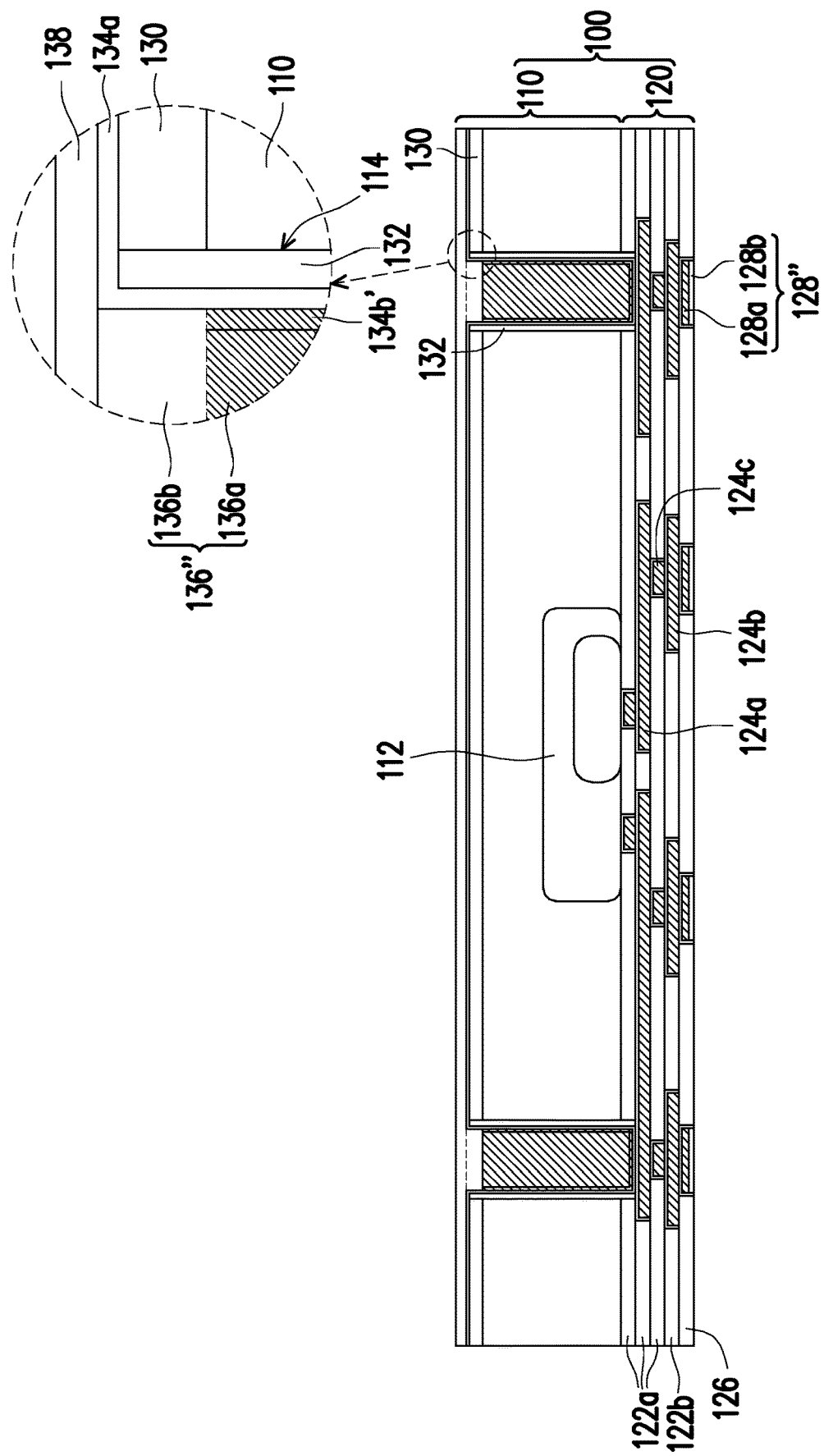

Referring to FIG. 16 and FIG. 17, an annealing process is performed on the (111)-oriented metal material layer 138 to transform a part of the conductive pillar 136' (that is, the part of the conductive pillar 136', which is in direct contact with the (111)-oriented metal material layer 138) into a (111)-oriented metal portion 128a. After the annealing process of the (111)-oriented metal material layer 138 is completed, annealed (111)-oriented metal grains such as (111)-oriented copper grains are epitaxially grown downward to transform the top portion of the conductive pillar 136' to the same (111)-orientation as the (111)-oriented metal material layer 138, so that the conductive pillar 136' is transformed into a conductive pillar 136" having different conductive parts 136a and 136b. After the annealing process of the (111)-oriented metal material layer 138 is performed, the conductive pillar 136" includes a first conductive part 136a and a second conductive part 136b located between the first conductive part 136a and the (111)-oriented metal material layer 138. The first conductive part 136a is a randomly oriented metal portion and the second conductive part 136b is a (111)-oriented metal portion. For example, the thickness of the second conductive part 136b is about 10 angstroms to about 500 angstroms.

In some embodiments, after the annealing process of the (111)-oriented metal material layer 138 is performed, the top end of the top seed layer 134b' that was originally randomly oriented may also be transformed into (111)-oriented metal. In addition, as shown in FIG. 17, the bottom seed layer 134a laterally covers the first conductive part 136a and the second conductive part 136b, and a part of the surface of the second conductive part 136b is not covered by the barrier layer 134a.

Figure 18:
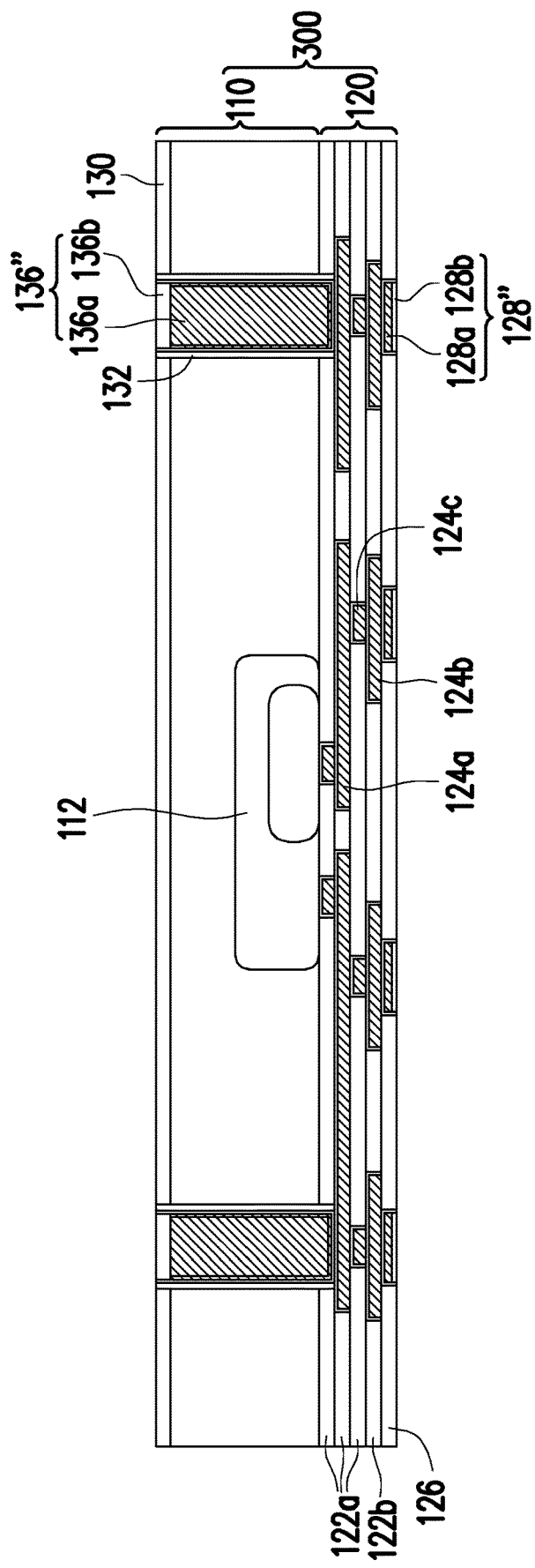

Referring to FIG. 17 and FIG. 18, after the conductive pillar 136" is formed, the (111)-oriented metal material layer 138 is removed to expose the upper surface of the second conductive part 136b. In this embodiment, a chemical mechanical polishing process is performed to form the conductive pillar 136", and the bottom seed layer 134a may serve as a polishing stop layer during the removal process of the (111)-oriented metal material layer 138. In some embodiments, due to polishing selectivity and/or polishing loading effect, the conductive pillar 136" has a slightly recessed upper surface, but the slightly recessed upper surface does not affect subsequent processes (for example, subsequent bonding process).

As shown in FIG. 18, after the conductive pillar 136" is completed, the preliminary fabrication of the semiconductor wafer 300 is completed. In this embodiment, the semiconductor wafer 300 includes the semiconductor substrate 110 and the interconnect structure 120. The semiconductor substrate 110 includes a plurality of semiconductor devices 112.

The interconnect structure 120 is disposed on the semiconductor substrate 110 and electrically connected to the semiconductor devices 112. The interconnect structure 120 includes at least one conductive pillar 136", and the conductive pillar 136" includes the first conductive part 136a and the second conductive part 136b connected to the first conductive part 136a. The first conductive part 136a includes randomly oriented metal and the second conductive part 136b includes (111)-oriented metal. The conductive pillar 136" penetrates through the semiconductor substrate 110, and the conductive pillar 136" is electrically connected to the interconnect structure 120. As shown in FIG. 18, the first end (for example, top end) of the first conductive part 136a of the conductive pillar 136" is connected to the interconnect structure 120, the second end (for example, bottom end) of the first conductive part 136a of the conductive pillar 136" is connected to the second conductive part 136b, and the first end is opposite to the second end. In addition, the first conductive part 136a of the conductive pillar 136" is connected to the interconnect structure 120, and the second conductive part 136b of the conductive pillar 136" is separated from the interconnect structure 120 by the first conductive part 136a.

Figure 19:
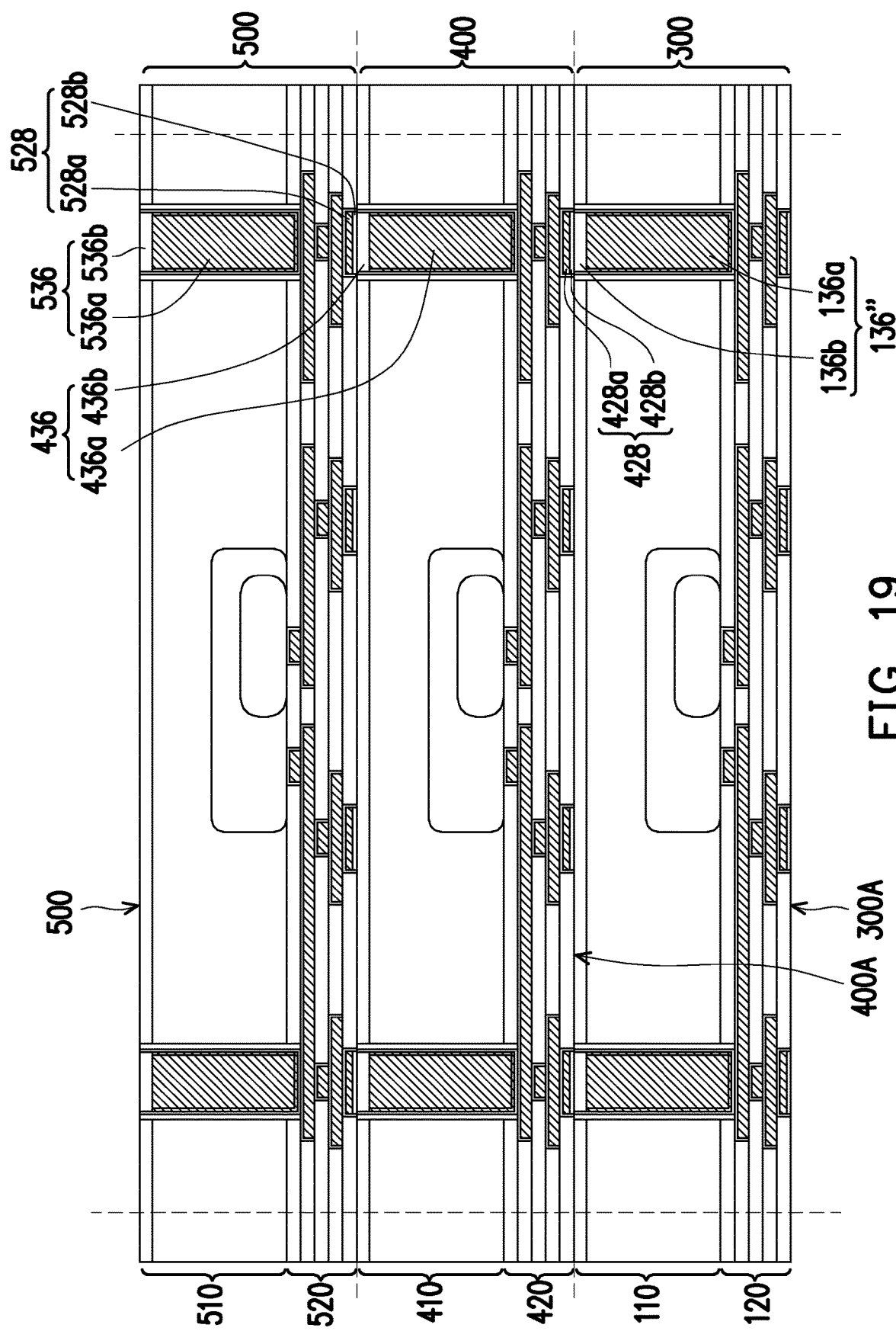

Referring to FIG. 19, a semiconductor wafer 400 and a semiconductor wafer 500 are provided. The semiconductor wafer 400 and the semiconductor wafer 500 are stacked on the semiconductor wafer 300, and a hybrid bonding process is performed to bond the semiconductor wafer 300, the semiconductor wafer 400, and the semiconductor wafer 500 to one another. In this embodiment, the semiconductor wafer 300 includes a semiconductor substrate 110 and an interconnect structure 120 disposed on the semiconductor substrate 110; the semiconductor wafer 400 includes a semiconductor substrate 410 and an interconnect structure 420 disposed on the semiconductor substrate 410; and the semiconductor wafer 500 includes a semiconductor substrate 510 and an interconnect structure 520 disposed on the semiconductor substrate 510. As shown in FIG. 19, the semiconductor wafer 400 and the semiconductor wafer 500 have a similar structure to the semiconductor wafer 300. The semiconductor wafer 300, the semiconductor wafer 400, and the semiconductor wafer 500 are stacked in a face-to-back manner. That is, the interconnect structure 120 in the semiconductor wafer 300 and the interconnect structure 420 in the semiconductor wafer 400 are electrically connected to each other through the conductive pillar 136", and the interconnect structure 420 in the semiconductor wafer 400 and the interconnect structure 520 in the semiconductor wafer 500 are electrically connected to each other through the conductive pillar 436. However, in alternative embodiments, the semiconductor wafer 400 and the semiconductor wafer 500 are stacked in a face-to-back manner. In this embodiment, the bonding interface between the semiconductor wafer 300 and the semiconductor wafer 400 is a hybrid bonding interface, and the bonding interface between the semiconductor wafer 400 and the semiconductor wafer 500 is a hybrid bonding interface. The aforementioned hybrid bonding interface includes a dielectric-to-dielectric bonding interface, a dielectric-to-metal bonding interface and a metal-to-metal bonding interface.

As shown in FIG. 19, the semiconductor wafer 400 and the semiconductor wafer 500 are stacked on the semiconductor wafer 300. The semiconductor wafer 300, the semiconductor wafer 400, and the semiconductor wafer 500 are bonded to one another by a wafer-to-wafer hybrid bonding process. In some other embodiments, not shown in the drawing, a plurality of semiconductor chips may be disposed on the semiconductor wafer 300, and a hybrid bonding process is performed so that the semiconductor wafer 300 and the semiconductor chips are bonded to each other by a chip-to-wafer hybrid bonding process.

After the aforementioned wafer-to-wafer hybrid bonding process or chip-to-wafer hybrid bonding process is performed, a wafer cutting process may be further performed on the semiconductor wafer 300, the semiconductor wafer 400, and the semiconductor wafer 500 to form a plurality of singulated bonding structures (that is, the structures between the two dotted lines). The aforementioned singulated bonding structure includes a first semiconductor chip 300A and a second semiconductor chip 400A. The first semiconductor chip 300A includes a plurality of first conductive pillars 136", and the first conductive pillar 136" includes a first conductive part 136a and a second conductive part 136b connected to the first conductive part 136a. The first conductive part 136a includes randomly oriented metal and the second conductive part 136b includes (111)-oriented metal. The second semiconductor chip 400A is stacked on the first semiconductor chip 300A. The second semiconductor chip 400A includes a plurality of second conductive pillars 436, and the second conductive pillar 436 includes a third conductive part 436a and a fourth conductive part 436b connected to the third conductive part 436a. The third conductive part 436a includes randomly oriented metal and the fourth conductive part 436b includes (111)-oriented metal. In addition, the second semiconductor chip 400A further includes a bonding conductor 428, and the bonding conductor 428 includes a fifth conductive part 428a and a sixth conductive part 428b. As shown in FIG. 19, the second conductive part 136b in the first semiconductor chip 300A is bonded to the sixth conductive part 428b in the second semiconductor chip 400A.

The aforementioned singulated bonding structure may further include a third semiconductor chip 500A stacked on the second semiconductor chip 400A. The third semiconductor chip 500A includes a plurality of third conductive pillars 536, and the third conductive pillar 536 includes a seventh conductive part 536a and an eighth conductive part 536b connected to the seventh conductive part 536a. The seventh conductive part 536a includes randomly oriented metal and the eighth conductive part 536b includes (111)-oriented metal. In addition, the third semiconductor chip 500A further includes a bonding conductor 528, and the bonding conductor 528 includes a ninth conductive part 528a and a tenth conductive part 528b. As shown in FIG. 19, the fourth conductive part 436b in the second semiconductor chip 400A is bonded to the tenth conductive part 528b in the third semiconductor chip 500A.

In some other feasible embodiments, not shown in the drawings, the semiconductor wafer 300 may be cut into a plurality of first semiconductor chips 300A first, then the second semiconductor chip 400A may be disposed on the first semiconductor chip 300A, and a hybrid bonding process may be performed, so that the first semiconductor chip and the second semiconductor chip are bonded to each other by a chip-to-chip hybrid bonding process.

Based on the above, in the fabricating processes of the semiconductor chip shown in FIG. 10 to FIG. 19, the conductive pillar (that is, TSV) is fabricated after FEOL and BEOL. However, the fabrication of the conductive pillar (that is, TSV) may be completed in other sequences, which will be described below with reference to FIG. 20A to FIG. 20C and FIG. 21A to FIG. 21D.

FIG. 20A to FIG. 20C and FIG. 21A to FIG. 21D are schematic diagrams respectively showing the fabricating processes of semiconductor chips according to different embodiments of the disclosure.

Figure 20C:
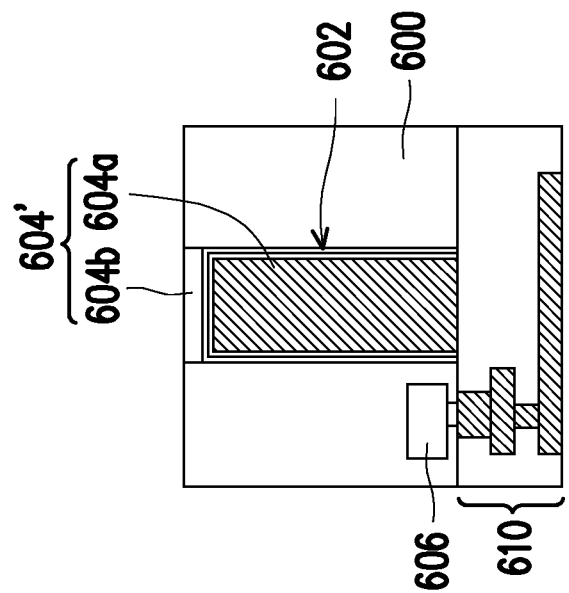
FIG. 20A to FIG. 20C and FIG. 21A to FIG. 21D are schematic diagrams respectively showing the fabricating processes of semiconductor chips according to different embodiments of the disclosure.
Figure 20B:
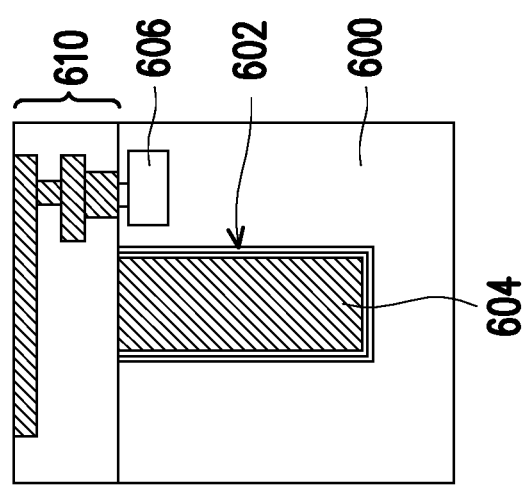
Figure 20A:
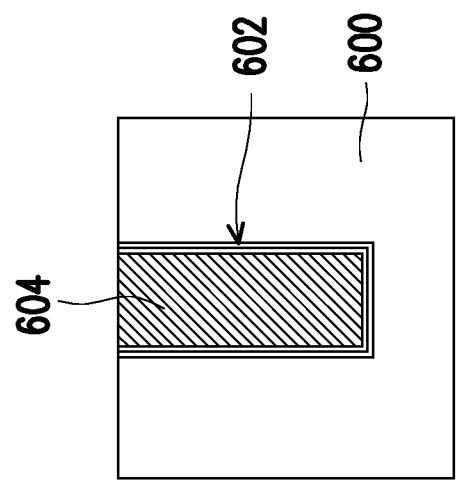
Figure 21A:
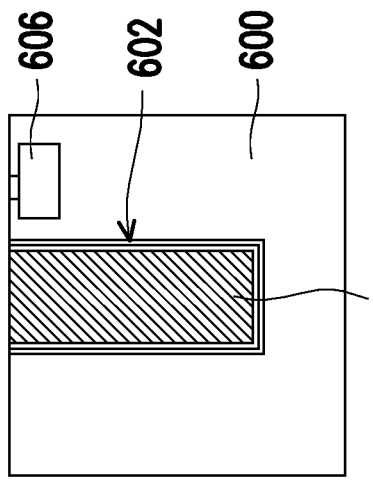
Figure 21B:
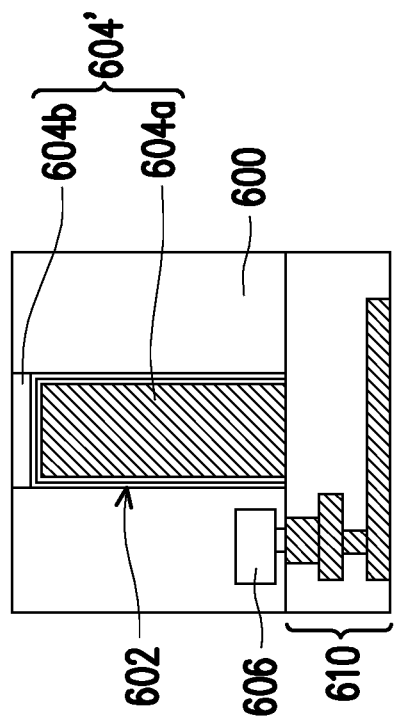
Figure 21C:
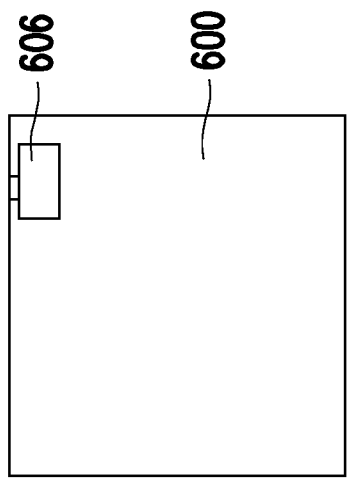
Figure 21D:
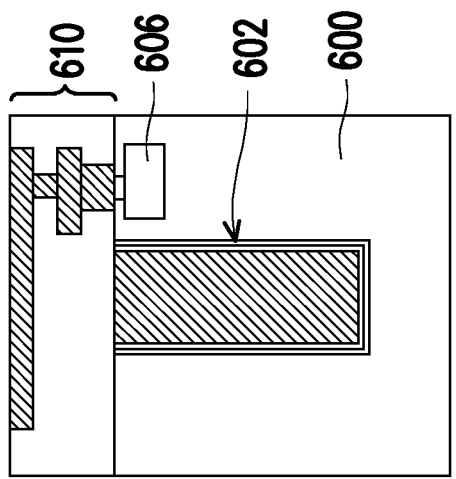

In FIG. 20A to FIG. 20C, the conductive pillar (that is, TSV) in the semiconductor chip is fabricated before FEOL and BEOL.

Referring to FIG. 20A to FIG. 20C, in this embodiment, the through hole 602 for accommodating the conductive pillar is formed in the semiconductor substrate 600 first, and after the through hole is formed, the conductive material 604 is filled in the through hole 602 (as shown in FIG. 20A), and then the FEOL and BEOL of the semiconductor chip are performed (as shown in FIG. 20B). The FEOL includes the fabrication of the semiconductor device 606 in the semiconductor substrate 600, and the BEOL includes the fabrication of the interconnect structure 610 on the semiconductor substrate 600. After the FEOL and BEOL of the semiconductor chip are completed, the randomly oriented metal portion 604a and the (111)-oriented metal portion 604b are fabricated in the conductive pillar 604', detailed processes of which are similar to those described in FIG. 16 and FIG. 17.

In FIG. 21A to FIG. 21D, the conductive pillar (that is, TSV) in the semiconductor chip is fabricated after FEOL and before BEOL.

Referring to FIG. 21A to FIG. 21D, in this embodiment, the FEOL of the semiconductor chip is performed first (as shown in FIG. 20A). The FEOL includes the fabrication of the semiconductor device 606 in the semiconductor substrate 600. After the FEOL of the semiconductor chip is completed, the through hole 602 for accommodating the conductive pillar is formed in the semiconductor substrate 600, and after the through hole is formed, the conductive material 604 is filled in the through hole 602 (as shown in FIG. 20B). Next, the BEOL of the semiconductor chip is performed (as shown in FIG. 20C), and the BEOL includes the fabrication of the interconnect structure 610 on the semiconductor substrate 600. After the BEOL of the semiconductor chip is completed, the randomly oriented metal portion 604a and the (111)-oriented metal portion 604b are fabricated in the conductive pillar 604', detailed processes of which are similar to those described in FIG. 16 and FIG. 17.

In the above-mentioned embodiments, the (111)-oriented is merely described for exemplary illustration, the present invention is not limited thereto.

To sum up, the oriented metal bonding interface adopted in the embodiments of the disclosure can effectively reduce the contact resistance, and the bonding process temperature required by the oriented metal bonding interface can be effectively reduced.

Although the disclosure has been described on the basis of the exemplary embodiments above, they are not intended to limit the disclosure. Those skilled in the art may make changes and modifications without departing from the spirit and scope of the disclosure. Therefore, the scope of protection of the disclosure shall be defined by the following claims.

What is claimed is:
1. A semiconductor chip, comprising:
a semiconductor substrate comprising a plurality of semiconductor devices; and
an interconnect structure disposed on the semiconductor substrate and electrically connected to the semiconductor devices, wherein the semiconductor substrate or the interconnect structure comprises at least one conductor, and the at least one conductor comprises a first conductive part and a second conductive part connected to the first conductive part, wherein the first conductive part comprises randomly oriented metal and the second conductive part comprises oriented metal.

2. The semiconductor chip according to claim 1, wherein the oriented metal comprises (111)-oriented metal, and the (111)-oriented metal comprises nano-twinned copper, nano-twinned gold, nano-twinned silver, nano-twinned cobalt, monocrystal copper, monocrystal gold, monocrystal silver or monocrystal cobalt.

3. The semiconductor chip according to claim 1, wherein the at least one conductor comprises a conductive pillar, the conductive pillar penetrates through the semiconductor substrate, and the conductive pillar is electrically connected to the interconnect structure.

4. The semiconductor chip according to claim 3, wherein a first end of the first conductive part of the conductive pillar is connected to the interconnect structure, a second end of the first conductive part of the conductive pillar is connected to the second conductive part, and the first end and the second end are opposite to each other.

5. The semiconductor chip according to claim 3, wherein the first conductive part of the conductive pillar is connected to the interconnect structure, and the second conductive part of the conductive pillar is separated from the interconnect structure by the first conductive part.

6. The semiconductor chip according to claim 1, wherein the at least one conductor comprises an outermost interconnect wire in the interconnect structure, and the outermost interconnect wire is electrically connected to the semiconductor devices.

7. The semiconductor chip according to claim 6, wherein the first conductive part of the outermost interconnect wire is connected to an inner interconnect wire of the interconnect structure, and the second conductive part of the outermost interconnect wire is separated from the inner interconnect wire by the first conductive part.

8. The semiconductor chip according to claim 1, wherein the at least one conductor further comprises a barrier layer laterally covering the first conductive part and the second conductive part, and a part of a surface of the second conductive part is not covered by the barrier layer.

9. A bonding structure, comprising:
a first semiconductor chip comprising a plurality of first conductors, wherein each of the first conductors comprises a first conductive part and a second conductive part connected to the first conductive part, the first conductive part comprises randomly oriented metal, and the second conductive part comprises oriented metal; and
a second semiconductor chip stacked on the first semiconductor chip and comprising a plurality of second conductors, wherein each of the second conductors comprises a third conductive part and a fourth conductive part connected to the third conductive part, the third conductive part comprises randomly oriented metal, and the fourth conductive part comprises oriented metal, wherein the second conductive part and the fourth conductive part are bonded to each other.

10. The bonding structure according to claim 9, wherein the first semiconductor chip comprises a first substrate and a first interconnect structure disposed on the first substrate, the second semiconductor chip comprises a second substrate and a second interconnect structure disposed on the second substrate, each of the first conductors comprises a conductive pillar penetrating through the first substrate, and each of the second conductors comprises an outermost interconnect wire located in the second interconnect structure.

11. The bonding structure according to claim 9, wherein the first semiconductor chip comprises a first substrate and a first interconnect structure disposed on the first substrate, the second semiconductor chip comprises a second substrate and a second interconnect structure disposed on the second substrate, each of the first conductors comprises an outermost interconnect wire located in the first interconnect structure, and each of the second conductors comprises an outermost interconnect wire located in the second interconnect structure.

12. The bonding structure according to claim 9, wherein the first semiconductor chip comprises a first substrate and a first interconnect structure disposed on the first substrate, the second semiconductor chip comprises a second substrate and a second interconnect structure disposed on the second substrate, each of the first conductors comprises a first conductive pillar penetrating through the first substrate, each of the second conductors comprises a second conductive pillar penetrating through the second substrate and an outermost interconnect wire located in the second interconnect structure, and the first conductive pillar and the outermost interconnect wire are bonded to each other.

13. The bonding structure according to claim 9, wherein the oriented metal comprises (111)-oriented metal, and the (111)-oriented metal comprises nano-twinned copper, nano-twinned gold, nano-twinned silver, nano-twinned cobalt, monocrystal copper, monocrystal gold, monocrystal silver or monocrystal cobalt.

14. The bonding structure according to claim 9, wherein the second conductive part and the fourth conductive part comprise the same material.

15. A fabricating method for fabricating a semiconductor chip, the fabricating method comprising:
forming a plurality of semiconductor devices in a semiconductor substrate; and
forming an interconnect structure on the semiconductor substrate, wherein the interconnect structure is electrically connected to the semiconductor devices, the semiconductor substrate or the interconnect structure comprises at least one conductor, and a forming method for forming the at least one conductor comprises:
forming a randomly oriented metal portion in the semiconductor substrate or the interconnect structure;
forming an oriented metal layer on the semiconductor substrate or the interconnect structure to cover the randomly oriented metal portion; and
performing a thermal annealing process to transform a part of a conductive part in the randomly oriented metal portion, which is in contact with the oriented metal layer, into an oriented metal portion.

16. The fabricating method for fabricating the semiconductor chip according to claim 15, further comprising:
removing the oriented metal layer to expose the oriented metal portion after forming the oriented metal portion.

17. The fabricating method for fabricating the semiconductor chip according to claim 15, wherein forming the at least one conductor in the interconnect structure comprises:
patterning a dielectric layer of the interconnect structure to form an opening in the dielectric layer; and
forming an interconnect wire in the opening of the dielectric layer.

18. The fabricating method for fabricating the semiconductor chip according to claim 15, wherein forming the at least one conductor in the semiconductor substrate comprises:

patterning the semiconductor substrate to form an opening in the semiconductor substrate before forming the semiconductor devices and the interconnect structure; and forming a conductive pillar in the opening of the semiconductor substrate.

19. The fabricating method for fabricating the semiconductor chip according to claim 15, wherein forming the at least one conductor in the semiconductor substrate comprises:

patterning the semiconductor substrate to form an opening in the semiconductor substrate after forming the semiconductor devices and before forming the interconnect structure; and forming a conductive pillar in the opening of the semiconductor substrate.

20. The fabricating method for fabricating the semiconductor chip according to claim 15, wherein forming the at least one conductor in the semiconductor substrate comprises:

patterning the semiconductor substrate to form an opening in the semiconductor substrate after forming the semiconductor devices and the interconnect structure; and forming a conductive pillar in the opening of the semiconductor substrate.

* * * * *